(12) United States Patent
Chen

(10) Patent No.: US 12,660,235 B2
(45) Date of Patent: Jun. 16, 2026

(54) SEMICONDUCTOR DEVICE AND FABRICATION METHOD THEREOF

(71) Applicant: Ark HDPS Semiconductor Pte. LIMITED., Singapore (SG)

(72) Inventor: Chin-Fu Chen, Hsinchu County (TW)

(73) Assignee: Ark HDPS Semiconductor Pte. LIMITED., Singapore (SG)

( * ) Notice: Subject to any disclaimer, the term of this patent is extended or adjusted under 35 U.S.C. 154(b) by 371 days.

(21) Appl. No.: 18/516,993

(22) Filed: Nov. 22, 2023

(65) Prior Publication Data

US 2025/0081506 A1 Mar. 6, 2025

Related U.S. Application Data

(60) Provisional application No. 63/536,429, filed on Sep. 3, 2023.

(30) Foreign Application Priority Data

Oct. 30, 2023 (TW) ................................. 112141464

(51) Int. Cl.
H01L 29/78 (2006.01)
H01L 29/66 (2006.01)
(Continued)

(52) U.S. Cl.
CPC ......... H10D 30/611 (2025.01); H10D 30/023 (2025.01); H10D 64/021 (2025.01); H10W 20/089 (2026.01)

(58) Field of Classification Search
CPC .. H10D 30/611; H10D 30/023; H10D 64/021; H10W 20/089; H01L 21/76816
(Continued)

(56) References Cited

U.S. PATENT DOCUMENTS

| | | | |
|---|---|---|---|
| 2009/0114980 A1 | 5/2009 | Pang | |
| 2013/0153987 A1* | 6/2013 | Venkatraman | ......... H10D 30/63 |
| | | | 257/329 |

(Continued)

FOREIGN PATENT DOCUMENTS

| | | | |
|---|---|---|---|
| CN | 101540338 B | * 12/2010 | ........... H10D 30/668 |
| CN | 109524472 A | 3/2019 | |

(Continued)

OTHER PUBLICATIONS

Chen, the specification, including the claims, and drawings in the U.S. Appl. No. 18/516,977, filed Nov. 22, 2023.

*Primary Examiner* — Tong-Ho Kim
(74) *Attorney, Agent, or Firm* — Winston Hsu

(57) ABSTRACT

A semiconductor device includes a substrate of first conductive type and an epitaxial layer; a first trench in the epitaxial layer; a first gate electrode structure in the first trench; a body region and the doped region of second conductivity type in the epitaxial layer, the body region is spaced apart from the first gate dielectric layer of the first gate electrode structure, the doped region is separated from the body region by the epitaxial layer and is contiguous with the first gate dielectric layer; a first electrode region of first conductivity type in the body region; a third gate structure on a top surface of the epitaxial layer, including a third gate and a third gate dielectric layer, the third gate structure partially overlaps the first gate dielectric layer and partially overlaps the body region; and a second electrode.

15 Claims, 17 Drawing Sheets

(51) Int. Cl.
*H10D 30/01* (2025.01)
*H10D 30/60* (2025.01)
*H10D 64/01* (2025.01)
*H10W 20/00* (2026.01)

(58) Field of Classification Search
USPC ........................................................ 257/288
See application file for complete search history.

(56) References Cited

U.S. PATENT DOCUMENTS

| | | | |
|---|---|---|---|
| 2016/0197169 | A1 | 7/2016 | Bobde |
| 2017/0330962 | A1 | 11/2017 | Zeng |
| 2017/0365704 | A1 | 12/2017 | Tsuchiko |
| 2019/0326430 | A1 | 10/2019 | Chen |
| 2021/0280680 | A1* | 9/2021 | Xu ........................ H10D 62/157 |

FOREIGN PATENT DOCUMENTS

| | | | |
|---|---|---|---|
| CN | 114361250 | A | 4/2022 |
| CN | 116325177 | A | 6/2023 |
| TW | 200921803 | | 5/2009 |
| TW | 201822295 | A | 6/2018 |
| TW | 201944596 | A | 11/2019 |

* cited by examiner

1000

1000

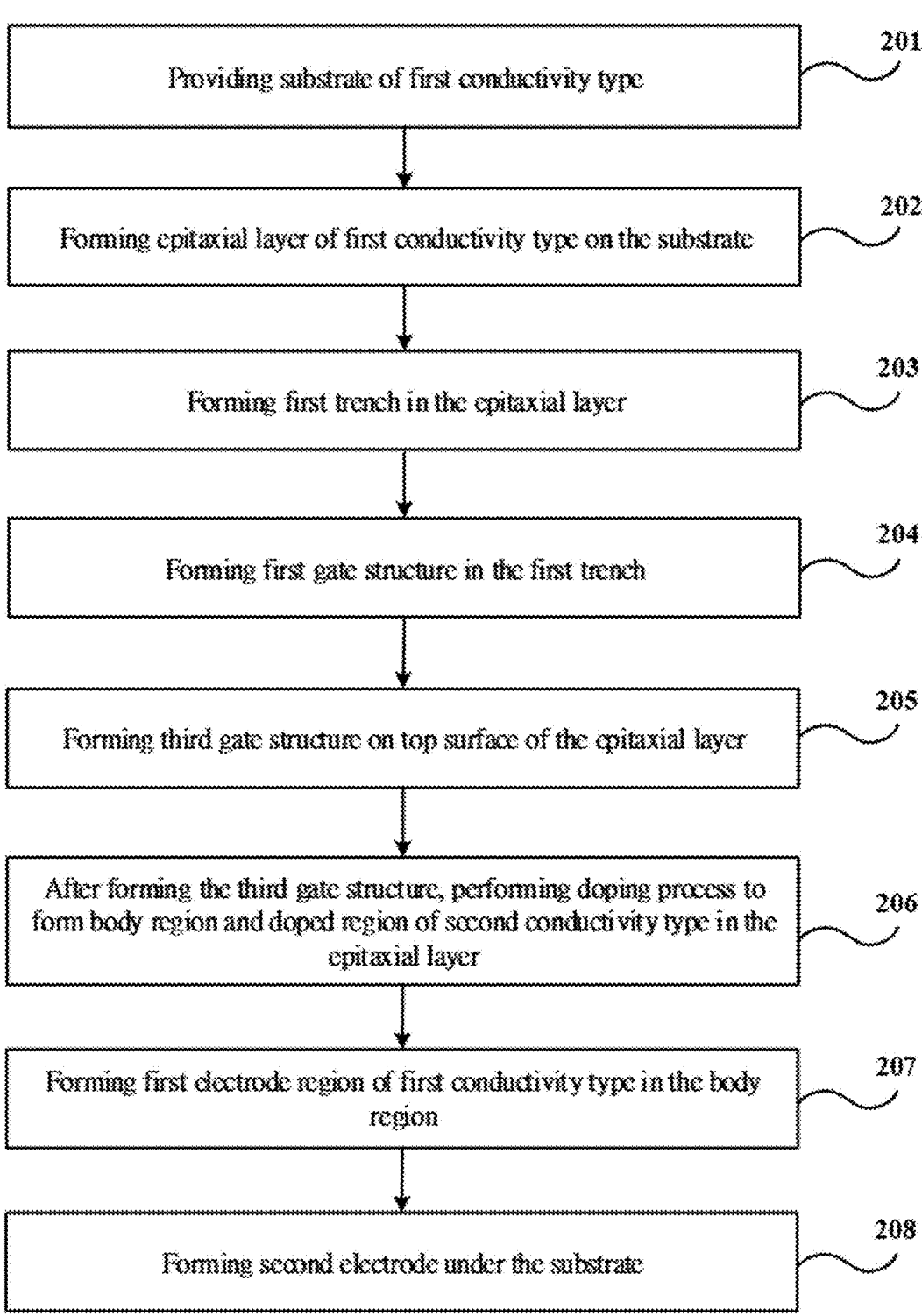

| | |
|---|---|
| Providing substrate of first conductivity type | 201 |
| Forming epitaxial layer of first conductivity type on the substrate | 202 |
| Forming first trench in the epitaxial layer | 203 |
| Forming first gate structure in the first trench | 204 |
| Forming third gate structure on top surface of the epitaxial layer | 205 |
| After forming the third gate structure, performing doping process to form body region and doped region of second conductivity type in the epitaxial layer | 206 |
| Forming first electrode region of first conductivity type in the body region | 207 |
| Forming second electrode under the substrate | 208 |

FIG. 28

SEMICONDUCTOR DEVICE AND FABRICATION METHOD THEREOF

CROSS REFERENCE TO RELATED APPLICATIONS

This application claims the benefit of U.S. Provisional Application No. 63/536,429, filed on Sep. 3, 2023. The content of the application is incorporated herein by reference.

BACKGROUND OF THE INVENTION

1. Field of the Invention

The present disclosure relates to the field of semiconductor technology, and in particular, to a semiconductor device and a manufacturing method thereof.

2. Description of the Prior Art

A power MOSFET is a type of metal-oxide-silicon field-effect transistor designed to handle significant power levels, which is central to a wide range of applications including consumer electronics, power supplies, DC-to-DC converters, motor controllers, radio-frequency (RF) applications, transportation technology, and automotive electronics.

SUMMARY OF THE INVENTION

One aspect of the present disclosure provides a semiconductor device including a substrate having a first conductivity type; an epitaxial layer having the first conductivity type on the substrate; a first trench in the epitaxial layer; a first gate structure including a first gate in the first trench, and a first gate dielectric layer between the first gate and the epitaxial layer; a first body region having a second conductivity type in the epitaxial layer, wherein the first body region is spaced from the first gate dielectric layer, wherein the second conductivity type is different from the first conductivity type; a doped region having the second conductivity type in the epitaxial layer and contiguous with the first gate dielectric layer, wherein the doped region is separated from the first body region by the epitaxial layer; a first electrode region having the first conductivity type in the first body region; a third gate structure on a top surface of the epitaxial layer, wherein the third gate structure comprises a third gate, and a third gate dielectric layer between the epitaxial layer and the third gate, wherein the third gate structure partially overlaps the first gate dielectric layer and partially overlaps the first body region; and a second electrode under the substrate.

According to some embodiments, the third gate structure does not overlap with the first gate.

According to some embodiments, the semiconductor device further includes a first spacer and a second spacer located on opposite sides of the third gate structure, wherein the first spacer is located on a surface of the first gate dielectric layer, and the second spacer is located on a surface of the first body region.

According to some embodiments, an extending direction of the third gate structure is first direction, and a size of an overlapping portion between the third gate structure and the first gate dielectric layer in second direction is less than or equal to 0.1 micrometers, and the second direction is substantially perpendicular to the first direction.

According to some embodiments, the first gate dielectric layer includes a first portion on a first sidewall of the first trench, a second portion on a second sidewall of the first trench and a third portion on a bottom of the first trench, wherein the third portion connects the first portion with the second portion.

The semiconductor device further includes a second body region, wherein the first body region and the second body region are respectively located on opposite sides of the first gate structure, wherein the third gate structure partially overlaps the first portion and partially overlaps the first body region.

The semiconductor device further includes a fourth gate structure on the top surface of the epitaxial layer, wherein the fourth gate structure partially overlaps the second portion and partially overlaps the second body region.

According to some embodiments, the semiconductor device further includes a second doped region, wherein the first doped region and the second doped region are respectively located on opposite sides of the first gate structure.

The first doped region is separated from the first body region by the epitaxial layer and the first doped region is contiguous with the first portion.

The second doped region is separated from the second body region by the epitaxial layer and the second doped region is contiguous with the second portion.

According to some embodiments, the first conductivity type is N type and the second conductivity type is P type; the first electrode region is a source region, and the second electrode is a drain.

Another aspect of the present disclosure provides a method for manufacturing a semiconductor device including the steps of: providing a substrate having a first conductivity type; forming an epitaxial layer having the first conductivity type on the substrate; forming a first trench in the epitaxial layer; forming a first gate structure in the first trench, wherein the first gate structure comprises a first gate in the first trench, and a first gate dielectric layer between the first gate and the epitaxial layer; forming a third gate structure on a top surface of the epitaxial layer, wherein the third gate structure comprises a third gate and a third gate dielectric layer between the epitaxial layer and the third gate, wherein the third gate structure partial overlap the first gate dielectric layer; after forming the third gate structure, performing a doping process to form a body region and a doped region having a second conductivity type in the epitaxial layer, wherein the body region partially overlaps the third gate structure, wherein the body region is spaced apart from the first gate dielectric layer, and the doped region is contiguous with the first gate dielectric layer, wherein the doped region is separated from the body region by the epitaxial layer, and wherein the second conductivity type is different from the first conductivity type; forming a first electrode region having the first conductivity type in the body region; and forming a second electrode under the substrate.

According to some embodiments, the method further includes forming a first spacer and a second spacer on opposite sides of the third gate structure, wherein the first spacer is located on a surface of the first gate dielectric layer, the second spacer is located on a surface of the body region.

According to some embodiments, an extending direction of the third gate structure is first direction, and a size of an overlapping portion between the third gate structure and the first gate dielectric layer in the second direction is less than or equal to 0.1 micrometers, and wherein the second direction is substantially perpendicular to the first direction.

According to some embodiments, the method further includes doping the first gate.

According to some embodiments, the first gate is doped before forming the body region; wherein the method further includes performing a first annealing after forming the body region.

According to some embodiments, said forming the third gate structure includes the steps of: forming the third gate dielectric layer on the top surface of the epitaxial layer; after forming the third gate dielectric layer, performing a second annealing; and forming the third gate on the third gate dielectric layer; wherein before forming the third gate dielectric layer, the first gate is doped.

According to some embodiments, the method further includes after forming the first spacer and the second spacer, forming a first silicide layer, a third silicide layer and a fourth silicide layer; wherein the first silicide layer is located on a top surface of the first gate, and the third silicide layer is located on a top surface of the third gate structure, and the fourth silicide layer is located on a top surface of the first electrode region.

According to some embodiments, the method further includes: when forming the third gate structure, simultaneously forming a fourth gate structure on a top surface of the epitaxial layer, and the third gate structure and the fourth gate structure are respectively located on opposite sides of the first gate structure, wherein the fourth gate structure comprises a fourth gate and a fourth gate dielectric layer between the epitaxial layer and the fourth gate, wherein the fourth gate structure partial overlaps the first gate dielectric layer.

According to some embodiments, the method further includes: when performing the doping process to form the first body region and the first doped region, simultaneously forming a second doped region having the second conductivity type in the epitaxial layer, and the first doped region and the second doped region are respectively located on opposite sides of the first gate structure, and the second doped region is contiguous with the first gate dielectric layer.

In the semiconductor device provided by the embodiment of the present disclosure, even if the actual position of the third gate structure deviates from the expected position, due to the doped region formed in the epitaxial layer between the body region and the first gate structure, the size of the epitaxial layer under the third gate structure in the second direction can be kept basically unchanged, thus reducing the adverse effects caused by the positional deviation of the third gate structure.

Other features, aspects, and advantages of the present disclosure will become apparent from the following detailed description of exemplary embodiments of the present disclosure with reference to the accompanying drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which constitute a part of this specification, illustrate exemplary embodiments of the disclosure and, together with the description, serve to explain principles of the disclosure.

The present disclosure may be more clearly understood from the following detailed description, with reference to the accompanying drawings, in which:

4

Figure 5:
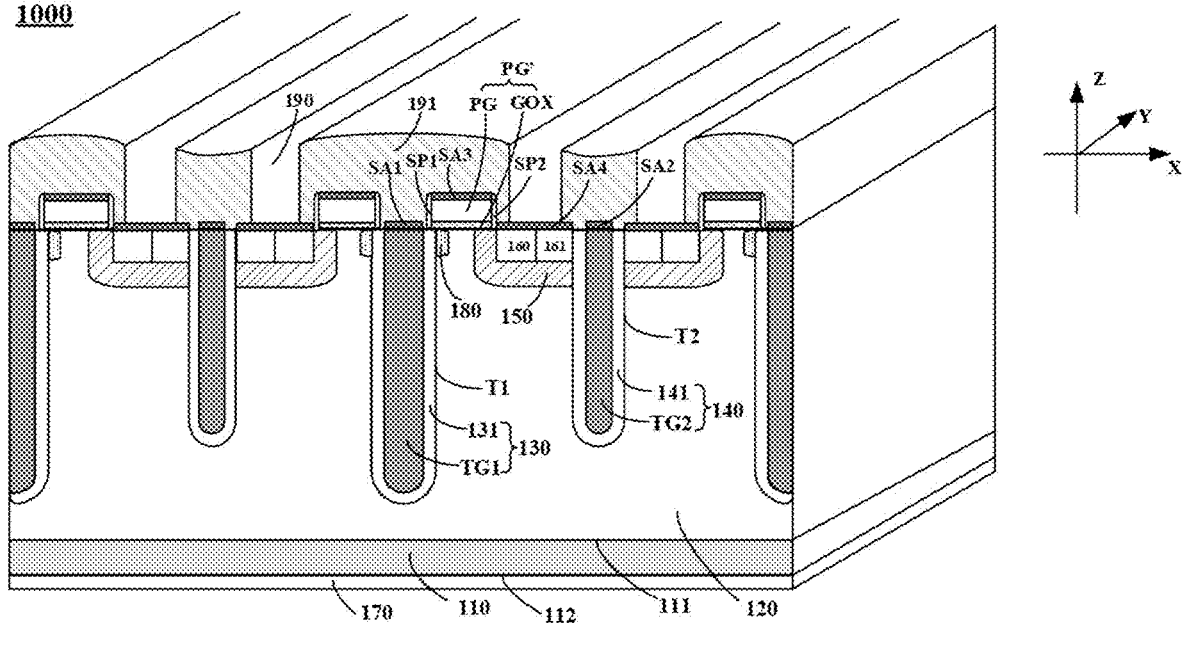
Figure 6:
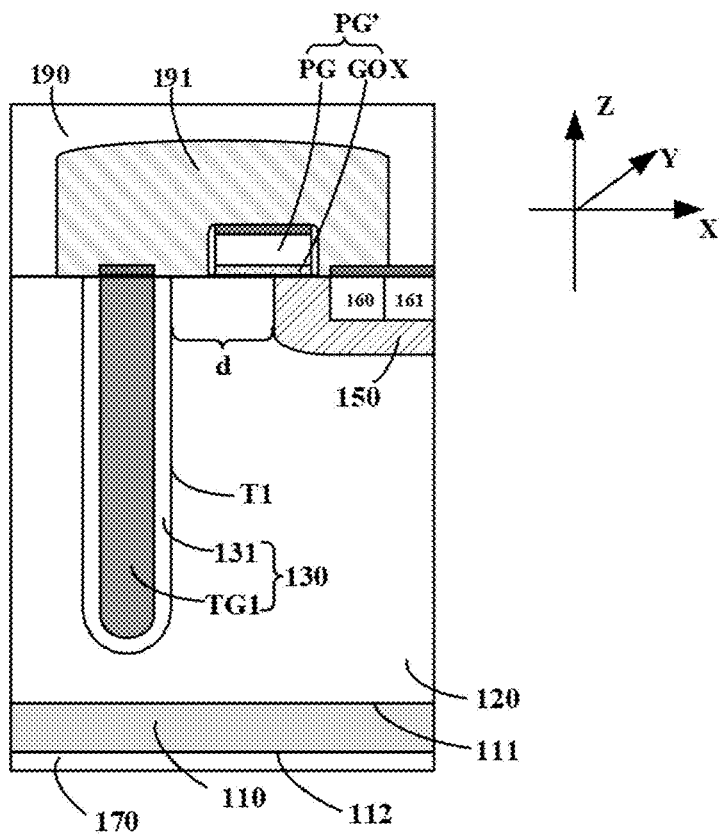
Figures 7, 8A:
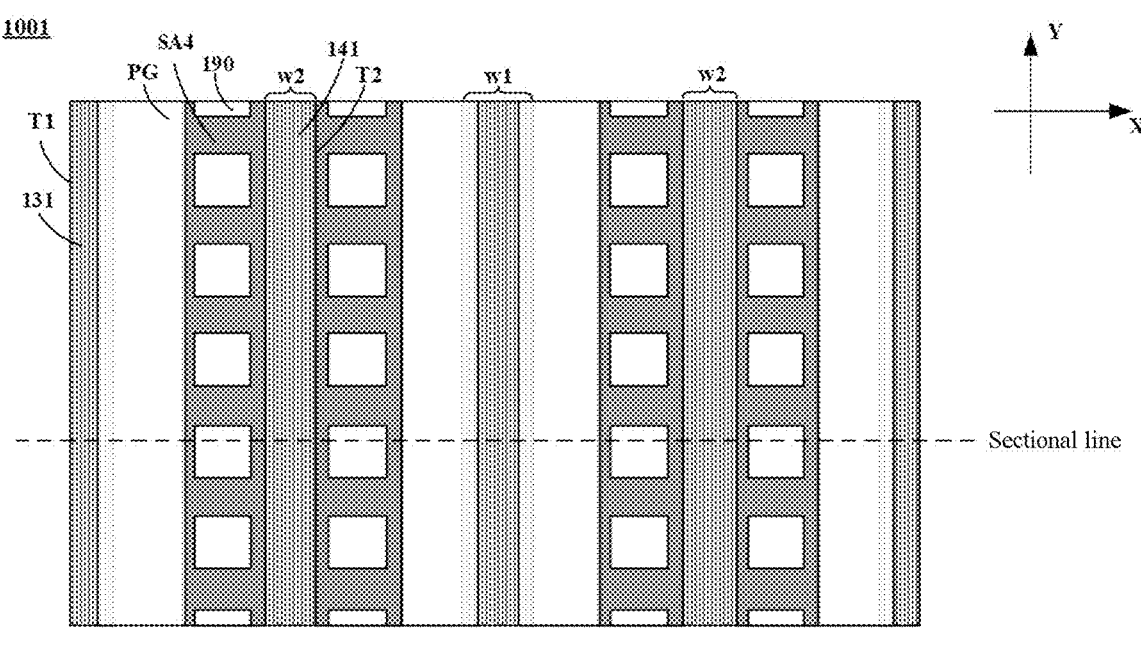
Figure 11:
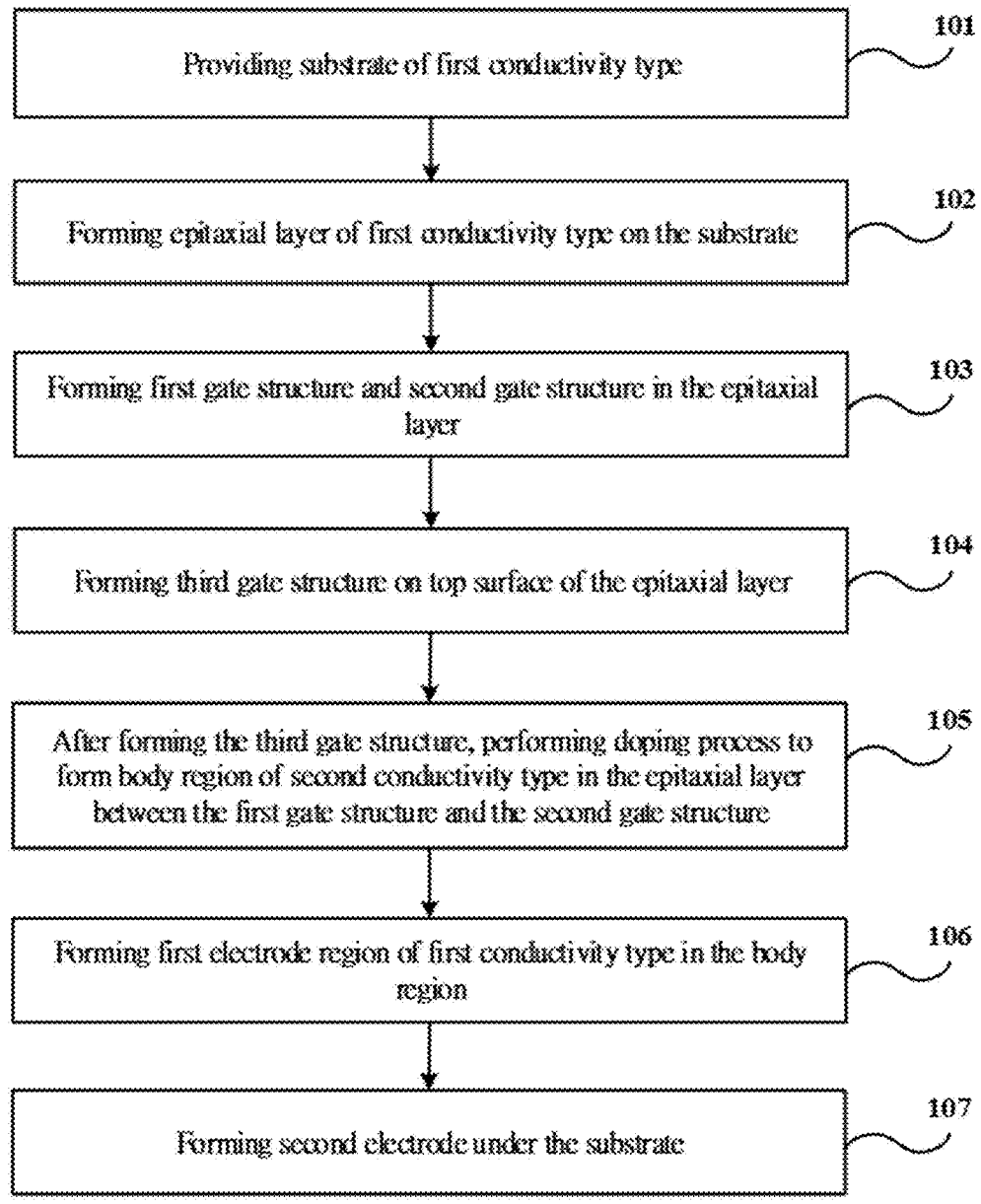

FIG. 1A, FIG. 1B, and FIG. 2 to FIG. 4 are cross-sectional views of a semiconductor device according to some embodiments of the present disclosure;

FIG. 5 is a perspective view of a semiconductor device according to some embodiments of the present disclosure;

FIG. 6 is a cross-sectional view of a semiconductor device according to some embodiments in the related art;

FIG. 7 is a top view of a semiconductor device according to some embodiments of the present disclosure;

FIGS. 8A-8C and FIGS. 9-10 are cross-sectional views of semiconductor devices according to other embodiments of the present disclosure;

FIG. 11 is a schematic flowchart of a method of manufacturing a semiconductor device according to some embodiments of the present disclosure;

FIG. 12 to FIG. 27 are cross-sectional views at different stages of a manufacturing method of a semiconductor device according to some embodiments of the present disclosure; and FIG. 28 is a schematic flowchart of a manufacturing method of a semiconductor device according to other embodiments of the present disclosure.

It should be understood that the dimensions of the various components shown in the drawings are not necessarily drawn to scale. In addition, the same or similar reference numbers indicate the same or similar components.

DETAILED DESCRIPTION

Various exemplary embodiments of the present disclosure will now be described in detail with reference to the accompanying drawings. The description of the exemplary embodiments is illustrative only and is in no way intended to limit the disclosure, its application or uses. The present disclosure may be implemented in many different forms and is not limited to the embodiments described herein. These embodiments are provided so that this disclosure will be thorough and complete, and will fully convey the scope of the disclosure to those skilled in the art. It should be noted that, unless otherwise specifically stated, the relative arrangements of parts and steps, compositions of materials, mathematical expressions, and numerical values set forth in these examples are to be construed as illustrative only and not as limitations.

"First," "second," and similar words used in this disclosure do not indicate any order, quantity, or importance, but are merely used to distinguish different parts. Similar words such as "include" or "include" mean that the elements before the word include the elements listed after the word, and do not exclude the possibility of also covering other elements. "Up", "down", etc. are only used to express relative positional relationships. When the absolute position of the described object changes, the relative positional relationship may also change accordingly.

In this disclosure, when a specific component is described as being between a first component and a second component, there may or may not be an intervening component between the specific component and the first component or the second component. When a specific component is described as being connected to other components, the specific component may be directly connected to the other components without intervening components, or may not be directly connected to the other components but have intervening components.

All terms (including technical terms or scientific terms) used in this disclosure have the same meanings as understood by one of ordinary skill in the art to which this disclosure belongs, unless otherwise specifically defined. It should also be understood that terms defined in, for example, general dictionaries should be construed to have meanings consistent with their meanings in the context of the relevant technology and should not be interpreted in an idealized or highly formalized sense, except as expressly defined herein.

Techniques, methods and apparatuses known to those of ordinary skill in the relevant art may not be discussed in detail, but where appropriate, such techniques, methods and apparatuses should be considered a part of the specification.

In related art, power transistors (such as power metal oxide semiconductor field effect transistors (MOSFETs)) are affected by changes in electrical quantities (such as drain-source voltage) under certain circumstances (such as when reverse biased), and internal carriers are prone to avalanche multiplication, resulting in avalanche breakdown, which can easily lead to conduction of the parasitic transistor inside the semiconductor device, thereby leading to damage to the semiconductor device.

In view of this, the present disclosure proposes the following solution, which can improve the avalanche durability of semiconductor devices to reduce the possibility of device damage.

FIG. 1A to FIG. 4 are cross-sectional views of semiconductor devices according to some embodiments of the present disclosure.

Figures 1A, 1B:
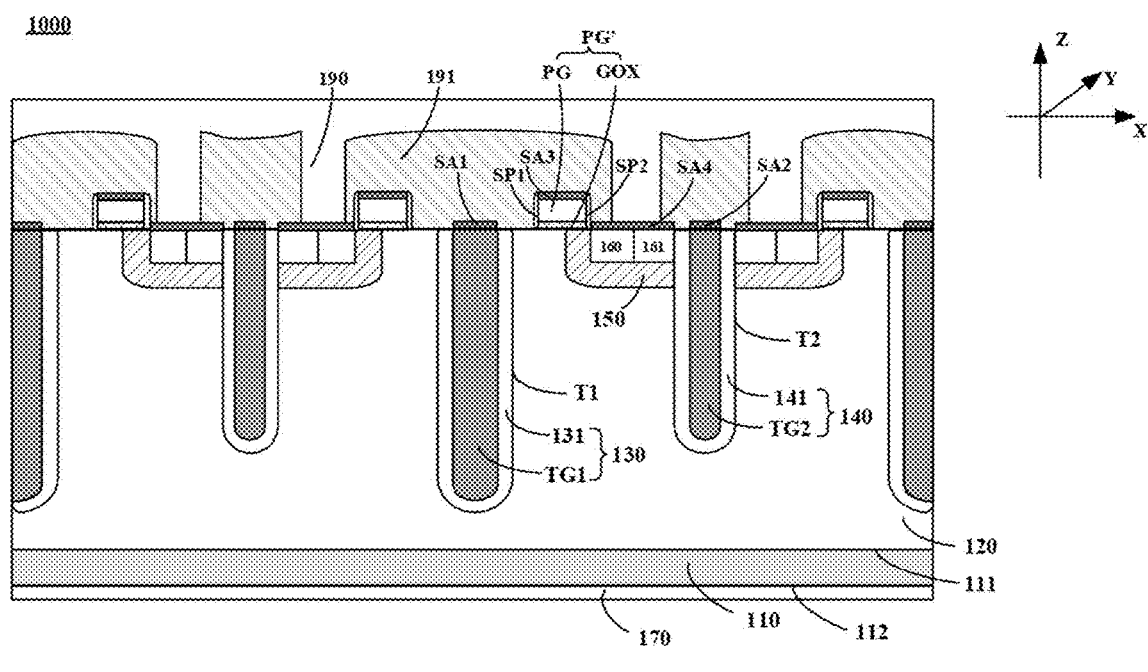

As shown in FIGS. 1A and 1B, the semiconductor device 1000 includes a substrate 110 and an epitaxial layer 120 located above the substrate 110. For example, the epitaxial layer 120 may be located on the first surface 111 of the substrate 110.

Both the substrate 110 and the epitaxial layer 120 have the first conductivity type. The first conductive type may be one of N type and P type. For example, the semiconductor device 1000 may be a power MOSFET.

The semiconductor device 1000 further includes a first gate structure 130, a second gate structure 140 and a body region 150. The first gate structure 130 and the second gate structure 140 are respectively disposed in the first trench T1 and the second trench T2.

The first gate structure 130 includes a first gate TG1 at least partially located in the epitaxial layer 120 and a first gate dielectric layer 131 located between the first gate TG1 and the epitaxial layer 120. The portion of the first gate TG1 located in the epitaxial layer 120 is surrounded by the first gate dielectric layer 131.

As some implementations, the surface of the first gate TG1 away from the substrate 110 is flush with the surface of the epitaxial layer 120 away from the substrate 110, that is, the first gate TG1 may be entirely located in the first trench T1.

According to some embodiments of the present disclosure, the top surface of the first gate TG1 is higher than the top surface of the epitaxial layer 120, that is, the first gate TG1 protrudes from the epitaxial layer 120. That is, the first gate TG1 may be partially located in the first trench T1, and the first gate TG1 may include a portion located in the first trench T1 and another portion located outside the first trench T1.

The second gate structure 140 includes a second gate TG2 at least partially located in the epitaxial layer 120 and a second gate dielectric layer 141 located between the second gate TG2 and the epitaxial layer 120. The portion of the second gate TG2 located in the epitaxial layer 120 is surrounded by the second gate dielectric layer 141.

According to an embodiment of the present disclosure, the top surface of the second gate TG2 is flush with the top surface of the epitaxial layer 120, that is, the second gate TG2 may be entirely located in the second trench T2.

According to other embodiments of the present disclosure, the surface of the second gate TG2 away from the substrate 110 is higher than the surface of the epitaxial layer 120 away from the substrate 110, that is, the second gate TG2 protrudes from the epitaxial layer 120. That is, the second gate TG2 may be partially located in the second trench T2, and the second gate TG2 may include a portion located in the second trench T2 and another portion located outside the second trench T2 and in the epitaxial layer 120.

In some embodiments, the first gate TG1 and the second gate TG2 may include conductive materials such as doped polysilicon or metal.

The body region 150 is located in the epitaxial layer 120 between the first gate structure 130 and the second gate structure 140. The body region 150 is spaced apart from first gate dielectric layer 131. The body region 150 and the first gate dielectric layer 131 are separated by the epitaxial layer 120. The body region 150 may extend from the top surface of the epitaxial layer 120 into the epitaxial layer 120.

In some embodiments, the body region 150 may be contiguous with the second gate dielectric layer 141.

In some embodiments, as shown in FIG. 1B, the semiconductor device 1000 further includes a doped region 180. The doped region 180 is located in the epitaxial layer 120 and is contiguous with the first gate dielectric layer 131, which will be discussed later in more detail.

The body region 150 has a second conductivity type that is different from the first conductivity type. For example, when the first conductivity type is N-type, the second conductivity type may be P-type, that is, the body region 150 is a P-type body region (or P-body).

The semiconductor device 1000 further includes a third gate structure PG', a first electrode region 160 and a second electrode 170.

The third gate structure PG' is located on the top surface of the epitaxial layer 120 and partially overlaps the body region 150. For example, as shown in FIG. 1A, the third gate structure PG' may partially overlap the body region 150 and may partially overlap the epitaxial layer 120 between the body region 150 and the second trench T2.

In some embodiments, as shown in FIG. 1A, the third gate structure PG' partially overlaps the body region 150 and does not overlap the first gate dielectric layer 131.

In some other embodiments, as shown in FIG. 1B, the third gate structure PG' partially overlaps the body region 150 and partially overlaps the first gate dielectric layer 131, but does not overlap with the first gate TG1, which will be discussed later in more detail.

The first electrode region 160 is located in the body region 150 and is, for example, a doped region with a first conductivity type. The second electrode 170 is located under the substrate 110. For example, the second electrode 170 may be located on the second surface 112 of the substrate 110 opposite to the first surface 111.

For example, the first electrode region 160 may be a source region, and the second electrode 170 may be a drain region.

In some embodiments, the semiconductor device 1000 may further include a doped region 161 located in the body region 150. The doped region 161 has the second conductivity type. For example, the doped region 161 may be located between the first electrode region 160 and the second gate structure 140. For example, the doped region 161 is a heavily doped region.

Figure 2:
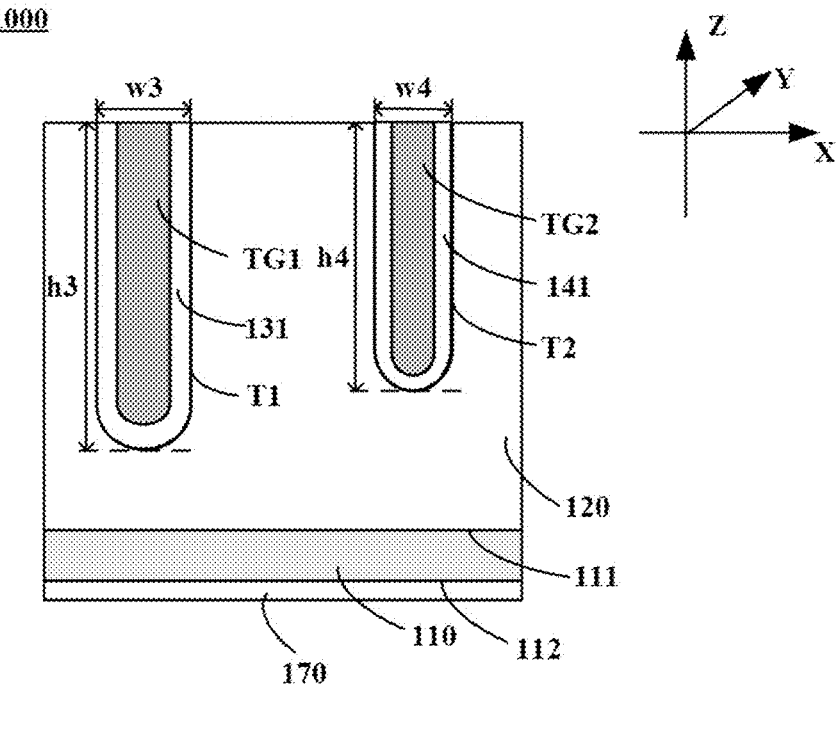
Figure 3:
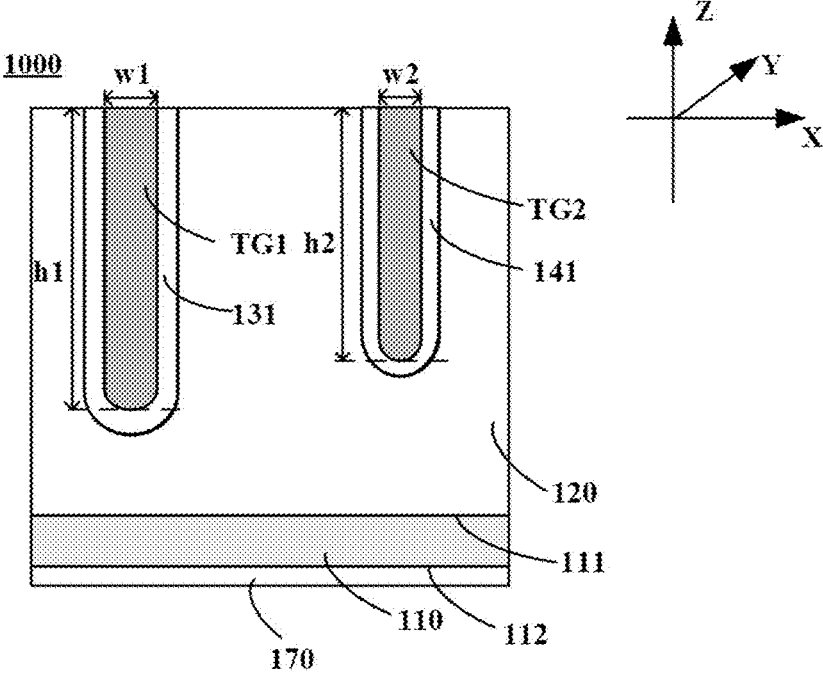

As shown in FIGS. 2 and 3, in the semiconductor device 1000, in the direction from the epitaxial layer 120 to the substrate 110, the depth h1 of the first gate TG1 in the epitaxial layer 120 is greater than the depth h2 of the second gate TG2 in the epitaxial layer 120.

In the direction from the epitaxial layer 120 to the substrate 110, the depth h3 of the first trench T1 in the epitaxial layer 120 is greater than the depth h4 of the second trench T2 in the epitaxial layer 120, that is, the bottom of the first trench 130 is closer to the substrate 110 than the bottom of the second trench 140. In some embodiments, the thickness of the first gate dielectric layer 131 and the thickness of the second gate dielectric layer 141 are substantially the same. In this case, the depth h1 of the first gate TG1 in the epitaxial layer 120 is greater than the depth h2 of the second gate TG2 in the epitaxial layer.

For example, the depth h3 of the first trench T1 in the epitaxial layer 120 is about 2.1 micrometers, the depth h4 of the second trench T2 in the epitaxial layer 120 is about 2.0 micrometers, the thickness of the first gate dielectric layer 131 and the thickness of the two gate dielectric layers 141 are both about 0.2 micrometers, so the depth h1 (approximately 1.9 micrometers) of the first gate TG1 in the epitaxial layer 120 is greater than the depth h2 (approximately 1.8 micrometers) of the second gate TG2 in the epitaxial layer 120.

Figure 4:
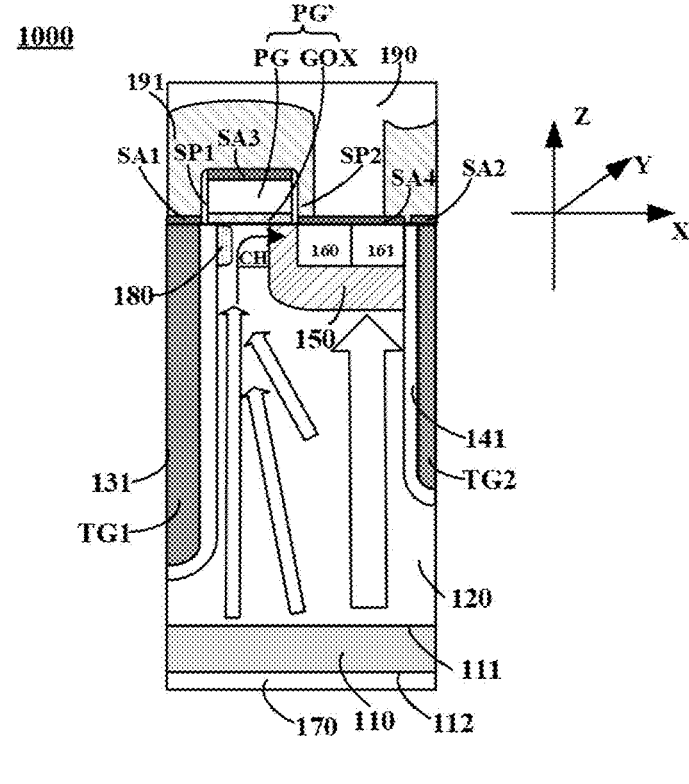

FIG. 4 shows a schematic diagram showing a portion of the semiconductor device 1000. The following takes the semiconductor device 1000 as an N-type transistor as an example to illustrate the flow direction of current in different scenarios.

When the semiconductor device 1000 is normally turned on, the current from the second electrode 170 flows in the direction indicated by the four thin arrows on the left side in FIG. 4 through the region of the epitaxial layer 120 closer to the first gate structure TG1 into the channel region CH under the third gate structure PG' and then flows to the first electrode region 160.

When avalanche breakdown occurs in the semiconductor device 1000, since the first gate TG1 and the second gate TG2 with different depths change the electric field structure in the epitaxial layer 120, the avalanche current will follow the direction shown by the thick arrow on the right in FIG. 4 and is concentrated to the first electrode region 160 through the shortest path between the second electrode 170 and the first electrode region 160 (i.e., through the region of the epitaxial layer 120 more closer to the second gate structure TG2).

Similarly, the first trench T1 and the second trench T2 with different depths also change the electric field structure in the epitaxial layer 120, so that the avalanche current may pass through the shortest path between the second electrode 170 and the first electrode region 160 in the direction shown by the thick arrow on the right in FIG. 4, and is concentrated to the first electrode region 160.

It can be seen that the current path of the semiconductor device during normal conduction is different from the current path during avalanche breakdown. The region of the epitaxial layer 120 through which the current flows during normal conduction is relatively closer to the first gate structure TG1, while the region of the epitaxial layer 120 through which the current lows during avalanche breakdown is relatively closer to the second gate structure TG2. In this way, the possibility of turning on the parasitic transistor inside the semiconductor device during avalanche breakdown can be reduced, thereby improving the avalanche durability of the semiconductor device and reducing the risk of device damage. In addition, the adverse impact of hot carriers during avalanche breakdown on the gate dielectric layer in the third gate structure PG' is also reduced.

FIG. 5 is a perspective view of a semiconductor device according to some embodiments of the present disclosure.

As shown in FIG. 5, the extending directions of the first trench T1 and the second trench T2 and the extending directions of the first gate TG1 and the second gate TG2 are both the first direction Y. The second direction X is substantially perpendicular to the first direction Y. The direction from the epitaxial layer 120 to the substrate 110 (i.e., the direction perpendicular to the substrate 110) is the third direction Z.

In some embodiments, as shown in FIG. 2, in the third direction Z, the depth h1 of the first gate TG1 in the epitaxial layer 120 is greater than the depth h2 of the second gate TG2 in the epitaxial layer 120, and the size w1 of the first gate TG1 in the second direction X is larger than the size w2 of the second gate TG2 in the second direction X.

In some embodiments, as shown in FIG. 3, in the third direction Z, the depth h3 of the first trench T1 in the epitaxial layer 120 is greater than the depth h4 of the second trench T2 in the epitaxial layer 120, and the size w3 of the first trench T1 in the second direction X is larger than the size w4 of the second trench T2 in the second direction. For example, the size w3 of the first trench T1 in the second direction X is about 0.65 micrometers, and the size w4 of the second trench T2 in the second direction is about 0.55 micrometers.

Since the etching gas enters more where the mask opening is larger, the trench formed after etching is deeper, while the etching gas enters less where the mask opening is smaller, making the trench formed after etching shallower. When the size w3 of the first trench T1 in the second direction X is larger than the size w4 of the second trench T2 in the second direction X, trenches with different depths can be formed through the same etching process, so that the manufacturing cost of semiconductor devices is reduced and the manufacturing efficiency is improved.

FIG. 6 is a cross-sectional view of a semiconductor device of some embodiments in the related art.

In the related art, as shown in FIG. 6, the third gate structure PG' and the first gate structure 130 do not overlap, and there is a large gap between them. During the process of forming the third gate structure PG', if the actual position of the third gate structure PG' deviates from the expected position, the subsequently formed body region 150 will also deviate accordingly, resulting in changes of the size d of the epitaxial layer 120 between the body region 150 and the first gate structure 130 in the second direction X, thereby adversely affecting the semiconductor device.

For example, when the actual position of the third gate structure PG' is shifted to the right relative to the expected position, the body region 150 will be shifted to the right accordingly, resulting in an enlarged size d of the epitaxial layer 120 in the second direction X between the body region 150 and the first gate structure 130. Therefore, the parasitic transistor inside the semiconductor device is more likely to be turned on, that is, the breakdown voltage of the semiconductor device is reduced, resulting in poor avalanche durability of the semiconductor device and a greater possibility of device damage.

For another example, when the actual position of the third gate structure PG' is shifted to the left relative to the expected position, the body region 150 will be shifted to the left accordingly, resulting in a smaller dimension d of the epitaxial layer 120 in the second direction X between the body region 150 and the first gate structure 130, which in turn causes the conduction resistance of the semiconductor device to increase, thereby adversely affecting the normal conduction of the semiconductor device.

In light of this, the present disclosure also proposes the following solutions.

FIG. 7 is a top view of a semiconductor device according to some embodiments of the present disclosure. FIG. 8A to FIG. 10 are cross-sectional views of semiconductor devices according to some embodiments of the present disclosure. FIG. 8C is a cross-sectional view taken along the section line in FIG. 7.

As shown in FIG. 7, FIGS. 8A to 8C, the semiconductor device 1001 includes a substrate 110 and an epitaxial layer 120 located on the first surface 111 of the substrate 110. Both the substrate 110 and the epitaxial layer 120 have the first conductivity type.

The semiconductor device 1001 further includes a first trench T1 and a first gate structure 130 located in the epitaxial layer 120.

The first gate structure 130 includes a first gate TG1 located in the first trench T1 and a first gate dielectric layer 131 located between the first gate TG1 and the epitaxial layer 120.

The semiconductor device 1001 further includes a body region 150, a first electrode region 160, a second electrode 170 and a third gate structure PG'.

The body region 150 is located in the epitaxial layer 120 and is spaced apart from the first gate dielectric layer 131. The body region 150 has a second conductivity type that is different from the first conductivity type. For example, the second conductivity type is P type, and the first conductivity type is N type.

The first electrode region 160 is located in the body region 150 and has the first conductivity type.

The second electrode 170 is located on the second surface 112 of the substrate 110 opposing the first surface 111. For example, the second electrode 170 is a drain electrode, and the first electrode region 160 is a source region.

The third gate structure PG' is located on the top surface of the epitaxial layer 120 and includes a third gate PG and a third gate dielectric layer GOX located between the epitaxial layer 120 and the third gate PG. The third gate structure PG' partially overlaps the first gate dielectric layer 131 and partially overlaps the body region 150.

In other words, the orthographic projection of the third gate PG and the third gate dielectric layer GOX on the substrate 110 partially overlaps with the orthographic projection of the first gate dielectric layer 131 on the substrate 110. For example, the third gate dielectric layer GOX directly contacts part of the surface of the first gate dielectric layer 131.

Figure 8B:
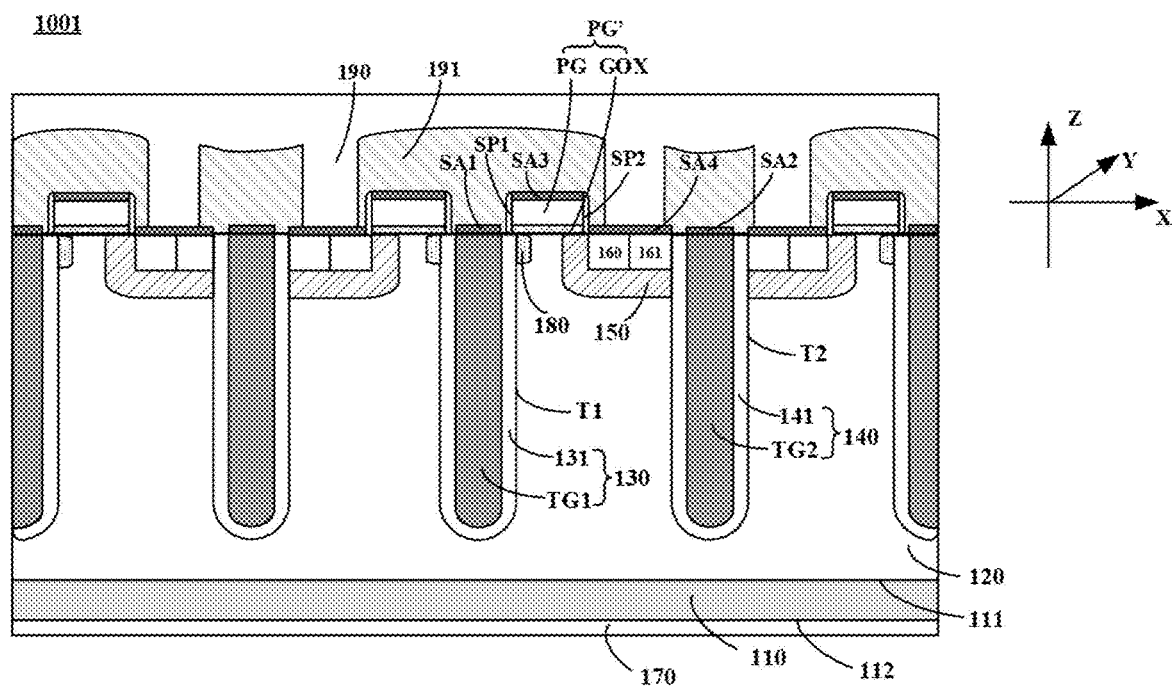
Figure 8C:
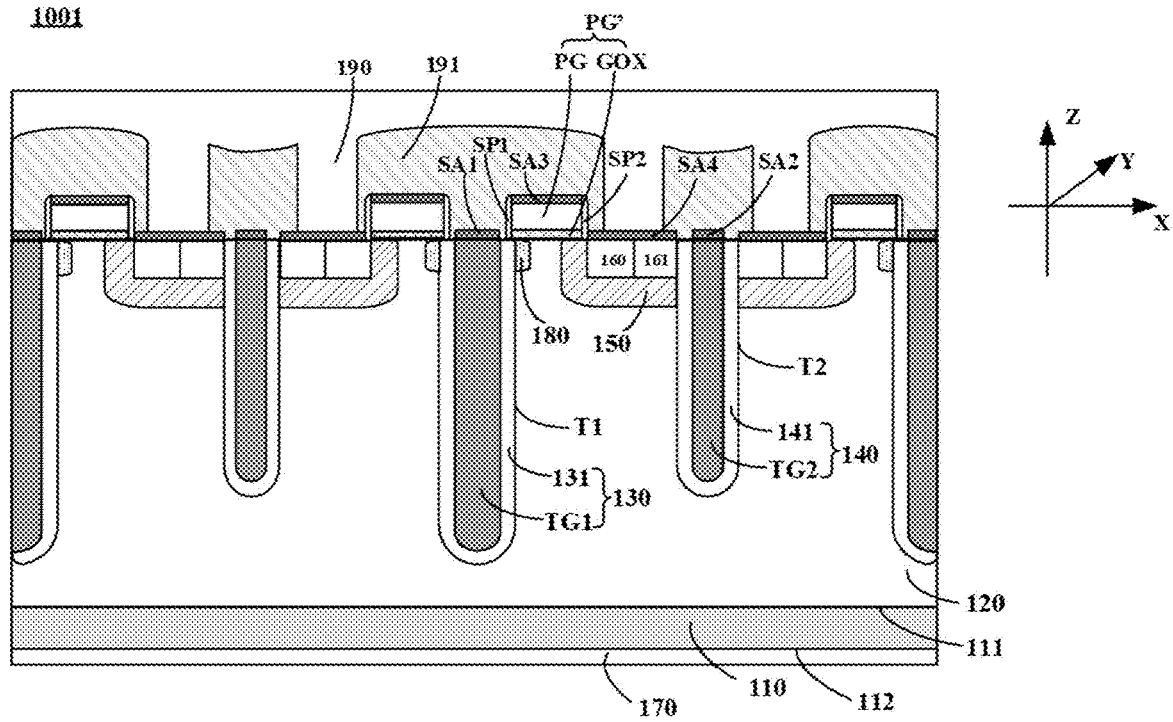

As shown in FIGS. 8B and 8C, the semiconductor device 1001 may further include a second trench T2 and a second gate structure 140. In the semiconductor device 1001, in the direction from the epitaxial layer 120 to the substrate 110, the depth of the first trench T1 in the epitaxial layer and the depth of the second trench T2 in the epitaxial layer may be the same (as shown in FIG. 8B), or can be different (as shown in FIG. 8C). The depth of the first gate TG1 in the epitaxial layer and the depth of the second gate TG2 in the epitaxial layer may be the same (as shown in FIG. 8B), or they may be different (as shown in FIG. 8C).

In the semiconductor device shown in FIG. 8A, the specific descriptions of the substrate 110, the epitaxial layer 120, the first trench T1, the first gate structure 130, the body region 150, the third gate structure PG', the first electrode region 160 and the second electrode 170 can be found in the embodiments as set forth in FIG. 1A to FIG. 5 and the associated text, and therefore will not be described again here.

In some embodiments, the third gate PG may include a conductive material such as doped polysilicon or metal. It is understood that the material of the third gate PG may be the same as or different from the materials of the first gate TG1 and the second gate TG2.

In some embodiments, the extending direction of the third gate structure PG' is the first direction Y, and the size of the overlapping portion of the third gate structure PG' and the first gate dielectric layer 131 in the second direction X can be less than or equal to 0.1 micrometers.

According to an embodiment, the size of the overlapping portion of the third gate structure PG' and the first gate dielectric layer 131 in the second direction X is greater than 50 nm. According to an embodiment, the size of the overlapping portion of the third gate structure PG' and the body region 150 in the second direction X (i.e., channel length) is greater than the size of the overlapping portion of the third gate structure PG' and the first gate dielectric layer 131 in the second direction X. Due to the minimum 50 nm size of the overlapping portion in the second direction X, it limits size of the subsequent formed doped region 180 in the second direction X.

In some embodiments, the third gate structure PG' does not overlap the first gate TG1, that is, the third gate dielectric layer GOX extends onto the surface of the first gate dielectric layer 131 but does not extend onto the surface of first gate TG1. In this way, the adverse effects caused by too little silicide on the first gate TG1 can be avoided.

In some embodiments, the semiconductor device 1001 may further include a doped region 180 having the second conductivity type (which may also be referred to as a corner doped region). The doped region 180 is located in the epitaxial layer 120 and is contiguous with the first gate dielectric layer 131. In addition, the doped region 180 and the body region 150 are separated by the epitaxial layer 120 therebetween. In some embodiments, the doped region 180 and the body region 150 may be formed in the same process steps, which will be further explained later.

Since the third gate structure PG' partially overlaps with the body region 150 and partially overlaps with the first gate dielectric layer 131, even if the actual position of the third gate structure PG' deviates from the expected position, the size of the epitaxial layer 120 between the body region 150 and the first gate structure 130 in the second direction X can still remain substantially unchanged.

The right end point of the third gate structure PG' determines the size of the body region 150 in the second direction X, and the left end point of the third gate structure PG' determines the size of the doped region 180 in the second direction X. In this way, even if the actual position of the third gate structure PG' is offset relative to the expected position, whether (1) the third gate structure PG' is offset to the left, making the size of the body region 150 in the second direction increase, while the size of the doped region 180 in the second direction X decrease; or (2) the third gate structure PG' is offset to the right, making the size of the body region 150 in the second direction X decrease, while the size of the doped region 180 in the second direction X increase, the size of the epitaxial layer 120 under the third gate structure PG' in the second direction X can remain substantially unchanged, thereby reducing the adverse effects caused by the positional shift of the third gate structure PG'. For example, the impact on the breakdown voltage of the semiconductor device is reduced, thereby improving the avalanche durability of the semiconductor device and reducing the risk of device damage.

This will be further described below with reference to FIG. 9 and FIG. 10, which illustrate part of the semiconductor device 1001 in FIG. 7.

Figures 9, 10:
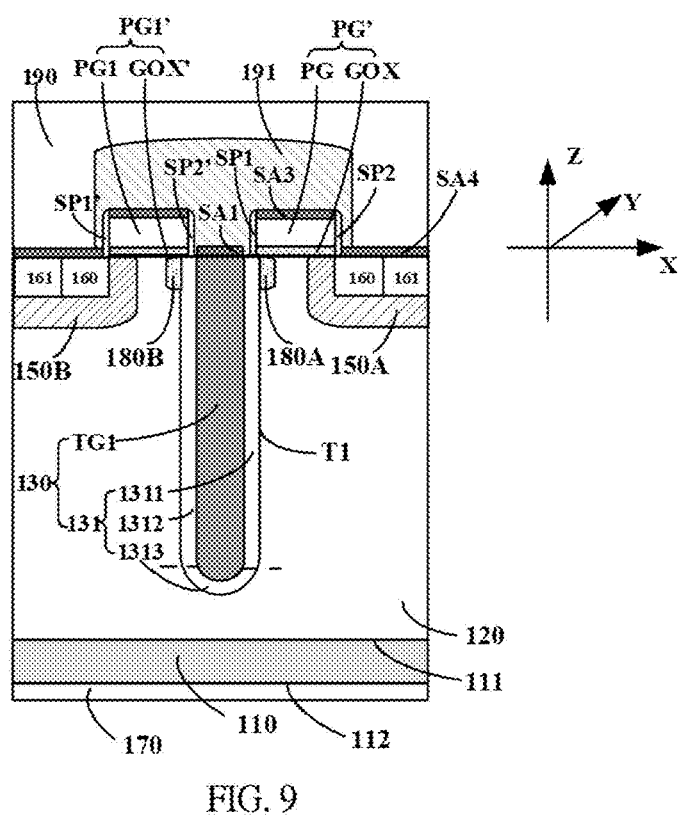

In some embodiments, as shown in FIG. 9, in the semiconductor device 1001, the first gate dielectric layer 131 includes a first portion 1311 located on the first sidewall of the first trench T1, a second portion 1312 located on the second sidewall of the first trench T1, and a third portion 1313 located on the bottom of the first trench T1. The third portion 1313 connects the first portion 1311 with the second portion 1312.

The semiconductor device 1001 includes a third gate structure PG', a fourth gate structure PG1', and two body regions 150 (i.e., a first body region 150A and a second body region 150B) located on opposite sides of the first gate structure 130.

The fourth gate structure PG1' is located on the top surface of the epitaxial layer 120, and the fourth gate structure PG1' includes a fourth gate PG1 and a fourth gate dielectric layer GOX' located between the top surface of the epitaxial layer 120 and the fourth gate PG1.

The third gate structure PG' partially overlaps the first portion 1311 of the first gate dielectric layer 131 and partially overlaps the first body region 150A. The fourth gate structure PG1' partially overlaps the second portion 1312 of the first gate dielectric layer 131 and partially overlaps the second body region 150B. For example, the third gate dielectric layer GOX is in contact with a partial surface of the first portion 1311 and is in contact with a partial surface of the first body region 150A. The fourth gate dielectric layer GOX' is in contact with a partial surface of the second portion 1312 and is in contact with a partial surface of the first body region 150A.

In some embodiments, the semiconductor device 1001 may include a first doped region 180A and a second doped region 180B located on opposite sides of the first gate structure 130.

The first doped region 180A and the first body region 150A are separated by the epitaxial layer 120, and the first doped region 180A is contiguous with the first portion 1311 of the first gate structure 130. The second doped region 180B and the second body region 150B are separated by the epitaxial layer 120, and the second doped region 180B is contiguous with the second portion 1312 of the first gate structure 130. For example, the second doped region 180B and the second body region 150B located on the left side of the first gate structure 130 may be separated by the epitaxial layer 120 on the left side of the first gate structure 130. The first doped region 180A and the first body region 150A on the right side of the first gate structure 130 may be separated by the epitaxial layer 120 on the right side of the first gate structure 130.

As shown in FIG. 10, if the actual positions of the third gate structure PG' and the fourth gate structure PG1' are offset to the left relative to the expected position, the body regions 150 located on opposite sides of the first gate structure 130 will be shifted to the left accordingly. In this case, during the subsequent process of forming the body region 150, a larger second doped region 180B will be formed on the left side of the first gate structure 130, and a smaller first doped region 180A or no first doped region 180A will be formed on the right side of the first gate structure 130, so that the size d1 of the epitaxial layer 120 under the fourth gate structure PG1' in the second direction X and the size d2 of the epitaxial layer 120 under the third gate structure PG' in the second direction X can remain substantially unchanged, thereby reducing the adverse effects caused by the offset of the third gate structure PG'.

It should be understood that if the actual positions of the third gate structure PG' and the fourth gate structure PG1' are offset to the right relative to the expected positions, the body regions 150 located on opposite sides of the first gate structure 130 will be shifted to the right accordingly. In this case, during the subsequent process of forming the body region 150, a smaller second doped region 180B or no second doped region 180B will be formed on the left side of the first gate structure 130, and a larger first doped region 180A will be formed on the right side of the gate structure 130, so that the size d1 of the epitaxial layer 120 under the fourth gate structure PG1' in the second direction X and the size d2 of the epitaxial layer 120 under the third gate structure PG' in the second direction X can remain substantially unchanged, thereby reducing the adverse effects caused by the offset of the third gate structure PG'

It should also be understood that if the actual positions of the third gate structure PG' and the fourth gate structure PG1' do not deviate from the expected positions, then in this case, the size d1 of the epitaxial layer 120 under the fourth gate structure PG1' in the second direction X (the size of the epitaxial layer 120 between the second doped region 180B and the second body region 150B) and the size d2 of the epitaxial layer 120 under the third gate structure PG' in the second direction X (the size of the epitaxial layer 120 between the first doped region 180A and the first body region 150A) will not change.

In some embodiments, please continue to refer to FIGS. 1A-1B and FIGS. 8A-8C, the semiconductor devices 1000/1001 may further include a first spacer SP1 and a second spacer SP2 located on opposite sides of the third gate structure PG'. As shown in FIG. 1B and FIG. 8A to FIG. 8C, the first spacer SP1 is located on the surface of the first gate dielectric layer 131, and the second spacer SP2 is located on the surface of the body region 150. The first spacer SP1 does not extend onto the surface of the first gate TG1. Therefore, the adverse effects caused by too little silicide on the first gate TG1 can be further avoided.

In some embodiments, the semiconductor devices 1000/1001 may further include a first silicide layer SA1, a second silicide layer SA2, a third silicide layer SA3, and a fourth silicide layer SA4. The first silicide layer SA1 is located on the top surface of the first gate TG1; the second silicide layer SA2 is located on the top surface of the second gate TG2; the third silicide layer SA3 is located on the top surface of the third gate structure PG'; The fourth silicide layer SA4 is located on the top surface of the first electrode region 160.

In some embodiments, the material of one or more of the first silicide layer SA1, the second silicide layer SA2, the third silicide layer SA3 and the fourth silicide layer SA4 may include cobalt silicide, nickel silicide, tungsten silicide or titanium silicide, etc.

In some embodiments, the semiconductor devices 1000/1001 may further include a metal layer 190 and an insulating layer 191. The metal layer 190 may be located on the fourth silicide layer SA4 and be electrically connected to the first electrode region 160 via the fourth silicide layer SA4. The metal layer 190 and the third gate structure PG' are separated by the insulating layer 191. For example, the first electrode region 160 may be the source region and the metal layer 190 may serve as the source.

FIG. 11 is a schematic flowchart of a method of manufacturing a semiconductor device according to some embodiments of the present disclosure. As shown in FIG. 11, the manufacturing method of a semiconductor device includes Steps 101 to 107. It is noteworthy that Steps 101 to 107 may not be executed sequentially in the order described below. For example, Step 107 may be performed after Step 101, that is, Step 107 may be performed before Step 102.

For the sake of clarity, the manufacturing method of the semiconductor device shown in FIG. 11 will be described below with reference to FIGS. 12-27. FIGS. 12-27 are cross-sectional views at different stages of a manufacturing method of a semiconductor device according to some embodiments of the present disclosure.

In Step 101, a substrate 110 having a first conductivity type is provided.

Figure 12:
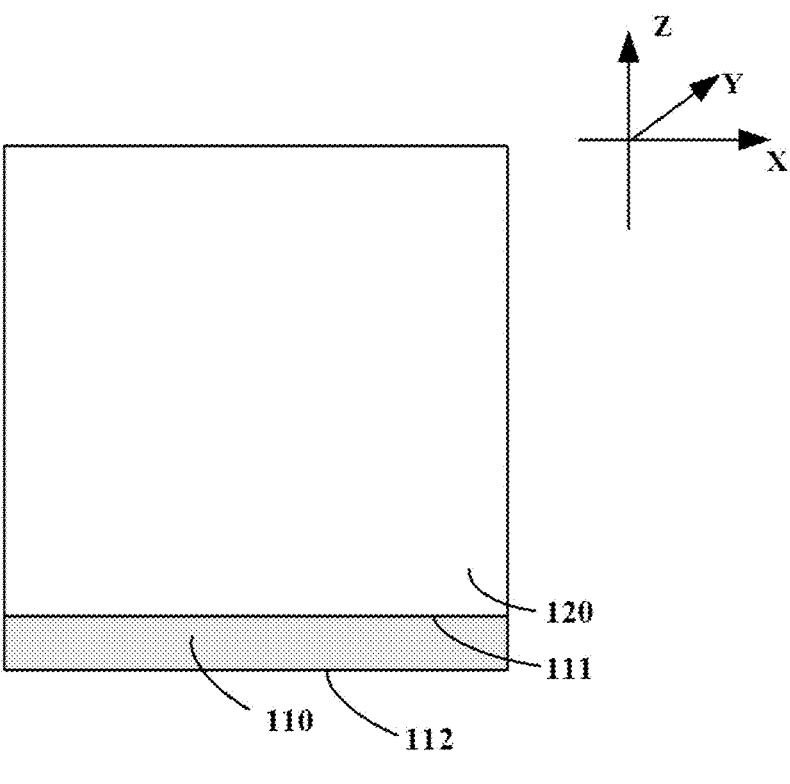

As shown in FIG. 12, the substrate 110 has opposing first surfaces 111 and second surfaces 112. In some embodiments, the material of the substrate 110 may be a semiconductor material such as silicon.

In Step 102, an epitaxial layer 120 having the first conductivity type is formed over the substrate 110, as shown in FIG. 12. For example, the epitaxial layer 120 having the first conductivity type is formed on the first surface 111 of the substrate 110. The first conductive type may be N type or P type.

In Step 103, the first gate structure 130 and the second gate structure 140 are formed in the epitaxial layer 120.

The first gate structure 130 includes a first gate TG1 at least partially located in the epitaxial layer 120, and a first gate dielectric layer 131 located between the first gate TG1 and the epitaxial layer 120. The second gate structure 140 includes a second gate TG2 at least partially located in the epitaxial layer 120 and a second gate dielectric layer 141 located between the second gate TG2 and the epitaxial layer 120.

In the direction from the epitaxial layer 120 to the substrate 110, the depth of the first gate TG1 in the epitaxial layer 120 is greater than the depth of the second gate TG2 in the epitaxial layer 120.

In some embodiments, the extending direction of the first gate TG1 and the second gate TG2 is the first direction Y. The size of the first gate TG1 in the second direction X is larger than the size of the second gate TG2 in the second direction. The second direction X is substantially perpendicular to the first direction Y.

Next, some embodiments of forming the first gate structure 130 and the second gate structure 140 will be introduced with reference to FIGS. 13-16.

Figure 13:
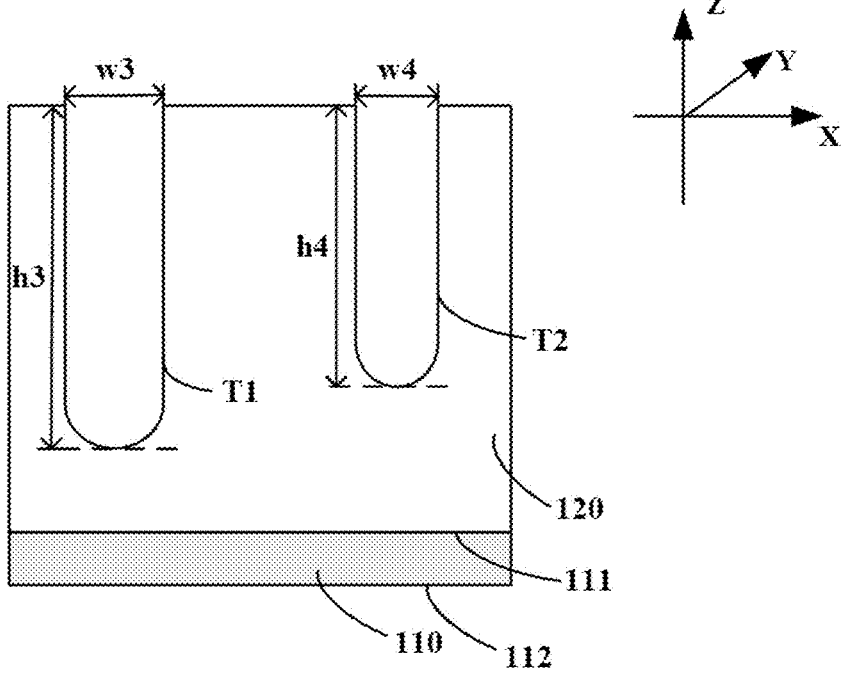

In some embodiments, as shown in FIG. 13, the first trench T1 and the second trench T2 may be formed in the epitaxial layer 120.

In the direction from the epitaxial layer 120 to the substrate 110, the depth h3 of the first trench T1 in the epitaxial layer 120 is greater than the depth h4 of the second trench T2 in the epitaxial layer 120, that is, the bottom of the first trench 130 is closer to the substrate 110 than the bottom of the second trench 140.

For example, the first trench T1 and the second trench T2 with different depths may be formed in the epitaxial layer 120 through a dry etching process. In some embodiments, the first trench T1 and the second trench T2 can be formed simultaneously through the same etching process to reduce the manufacturing cost of semiconductor devices and improve manufacturing efficiency.

In some embodiments, referring to FIG. 13, the extending direction of the first trench T1 and the second trench T2 is the first direction Y. The size w3 of the first trench T1 in the second direction X is larger than the size w4 of the second trench T2 in the second direction X.

As some implementations, the first gate structure 130 can be formed in the first trench T1 and the second gate structure 140 can be formed in the second trench T2 according to the Steps S1-S3 described below.

Figure 14:
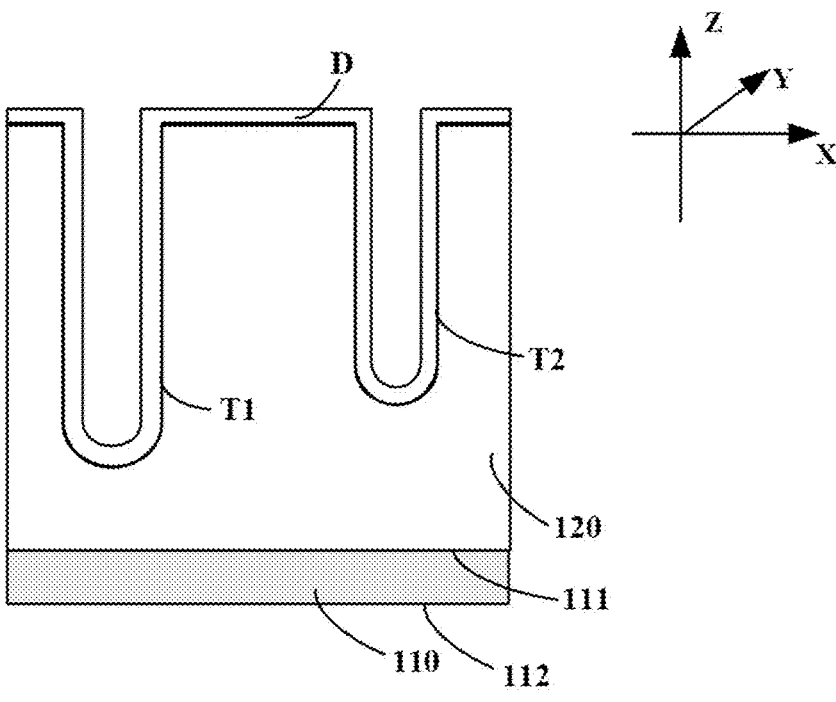

S1: As shown in FIG. 14, a dielectric material layer D is formed on the bottom and sidewalls of the first trench T1, the bottom and sidewalls of the second trench T2, and the top surface of the epitaxial layer 120.

For example, the dielectric material layer D may be formed using a chemical vapor deposition process.

In some embodiments, the thickness of the dielectric material layer D may be about 0.2 micrometers.

Figure 15:
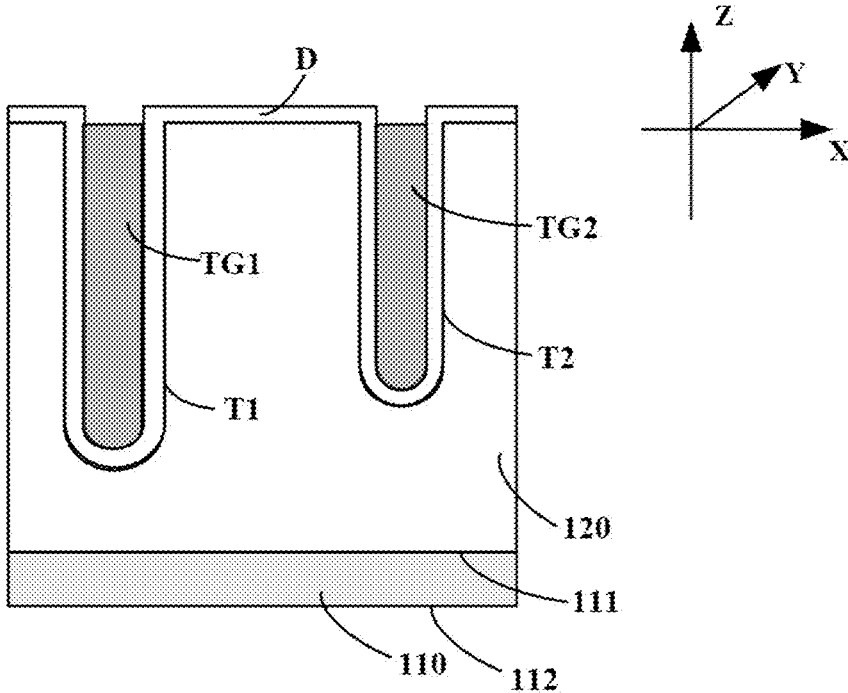

S2: As shown in FIG. 15, after the dielectric material layer D is formed, the first trench T1 and the second trench T2 are then filled with conductive material to form the first gate TG1 and the second gate TG2.

For example, a chemical vapor deposition process may be used to fill the first trench T1 and the second trench T2 formed with the dielectric material layer D with conductive material to form the first gate TG1 and the second gate TG2. For example, the conductive material may include doped polysilicon or metal.

Figure 16:
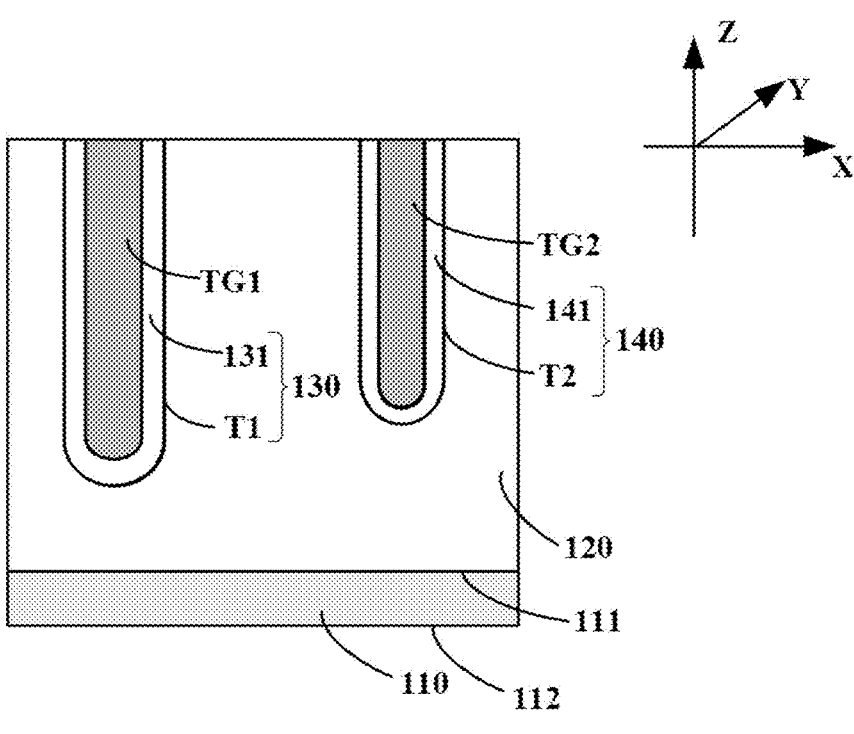

S3: As shown in FIG. 16, the portion of the dielectric material layer D on the top surface of the epitaxial layer 120 is removed.

After the removal is performed, the dielectric material layer D on the bottom and sidewalls of the first trench T1 serves as the first gate dielectric layer 131, and the dielectric material layer D on the bottom and sidewalls of the second trench T2 serves as the second gate dielectric layer 141. The first gate TG1 is surrounded by the first gate dielectric layer 131, and the second gate TG2 is surrounded by the second gate dielectric layer 141.

For example, a portion of the dielectric material layer D on the top surface of the epitaxial layer 120 may be removed through a planarization process or an etch-back process, thereby forming the first gate structure 130 and the second gate structure 140. The planarization process is, for example, a chemical mechanical polishing (CMP) process.

In some embodiments, the first gate dielectric layer 131 and the second gate dielectric layer 141 are formed to have substantially the same thickness.

In Step 104, a third gate structure PG' is formed on the top surface of the epitaxial layer 120.

Figure 17:
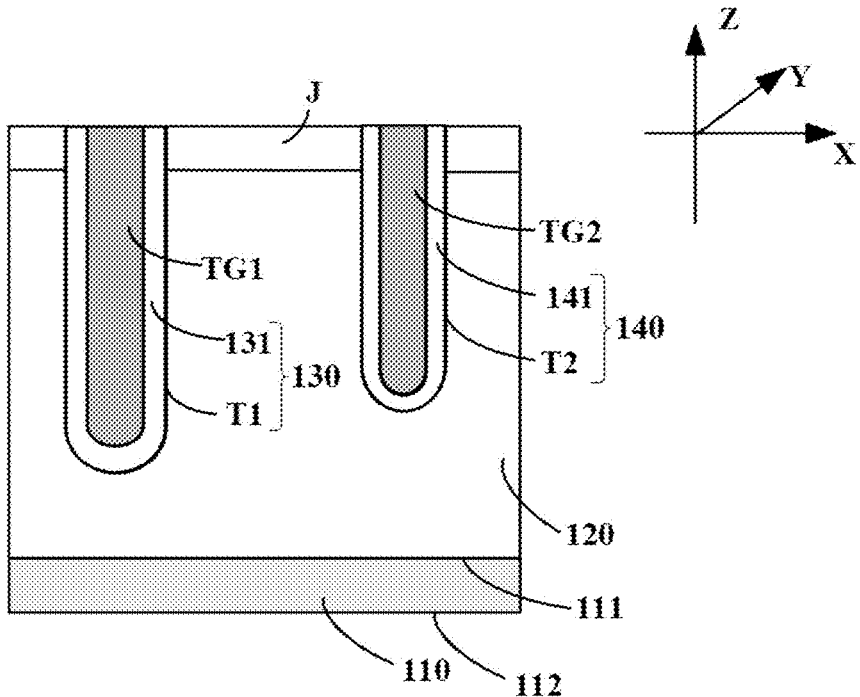

In some embodiments, as shown in FIG. 17, after forming the first gate structure 130 and the second gate structure 140, a doping process may be performed to form a well region J in the epitaxial layer 120. After the formation of the well region J, the third gate structure PG' is formed. For example, the well region J may have a first conductivity type (e.g., N-type).

Figure 18:
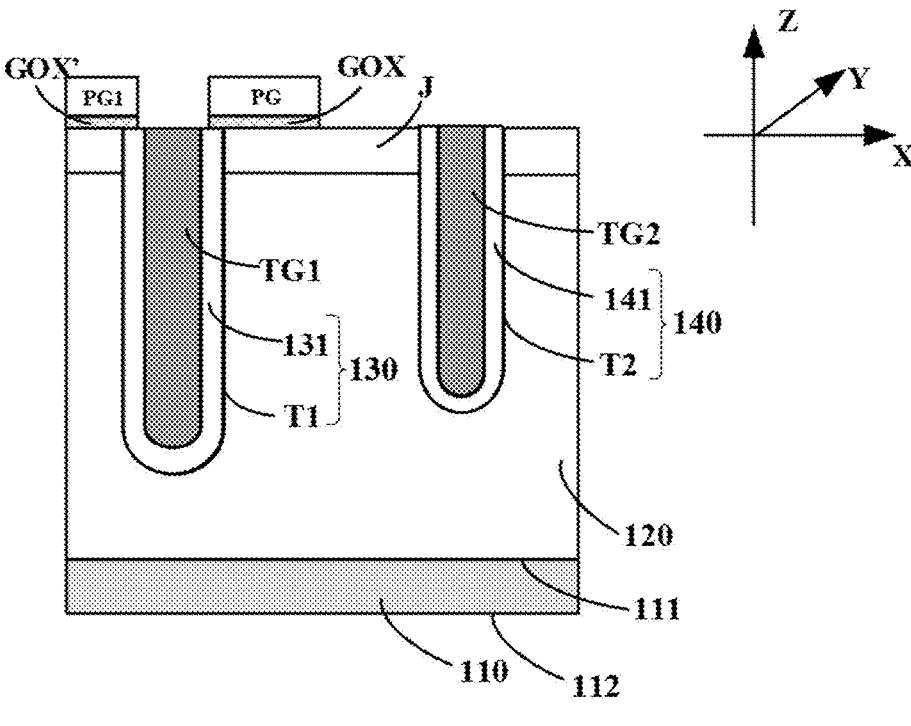

In some embodiments, as shown in FIG. 18, a third gate dielectric layer GOX may be formed on the top surface of the epitaxial layer 120 first, and then, the third gate electrode may be formed on the third gate dielectric layer GOX, thereby forming the third gate structure PG' including a third gate dielectric layer GOX and a third gate PG.

In some embodiments, as shown in FIG. 18, the formed third gate structure PG' partially overlaps the body region 150 and partially overlaps the first gate dielectric layer 131. In some embodiments, the size of the overlapping portion of the third gate structure PG' and the first gate dielectric layer 131 in the second direction X is less than or equal to 0.1 micrometers.

Figure 19:
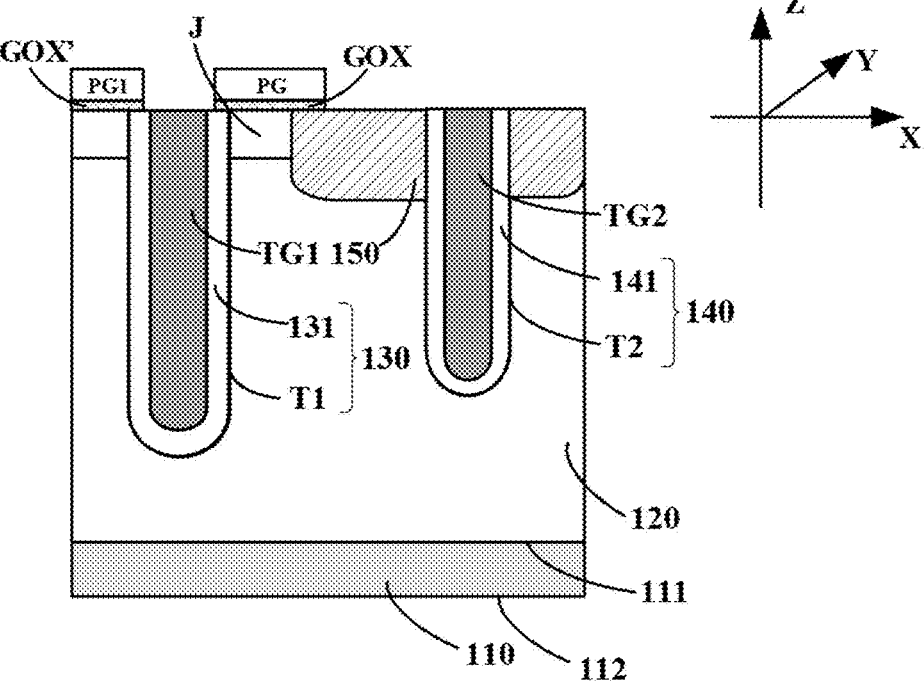

As shown in FIG. 19, in Step 105, after forming the third gate structure PG', a doping process is performed to form a body region 150 having the second conductivity type in the epitaxial layer 120 between the first gate structure 130 and the second gate structure 140. For example, the doping process is performed using the third gate structure PG' as a mask. For the area on the right side of the third gate structure PG', dopants are implanted in different directions such as the direction with an incident angle inclined to the Z direction, in the positive X direction, the negative X direction, the positive Y direction, and the negative Y direction, so as to form the body region 150 of the second conductivity type in the epitaxial layer 120 between the right endpoint of the third gate structure PG' and the second gate structure 140.

The body region 150 partially overlaps the third gate structure PG' and the body region 150 is spaced apart from the first gate dielectric layer 131. The second conductivity type is different from the first conductivity type.

In some embodiments, the body region 150 is contiguous with the second gate dielectric layer 141.

Figures 20, 21:
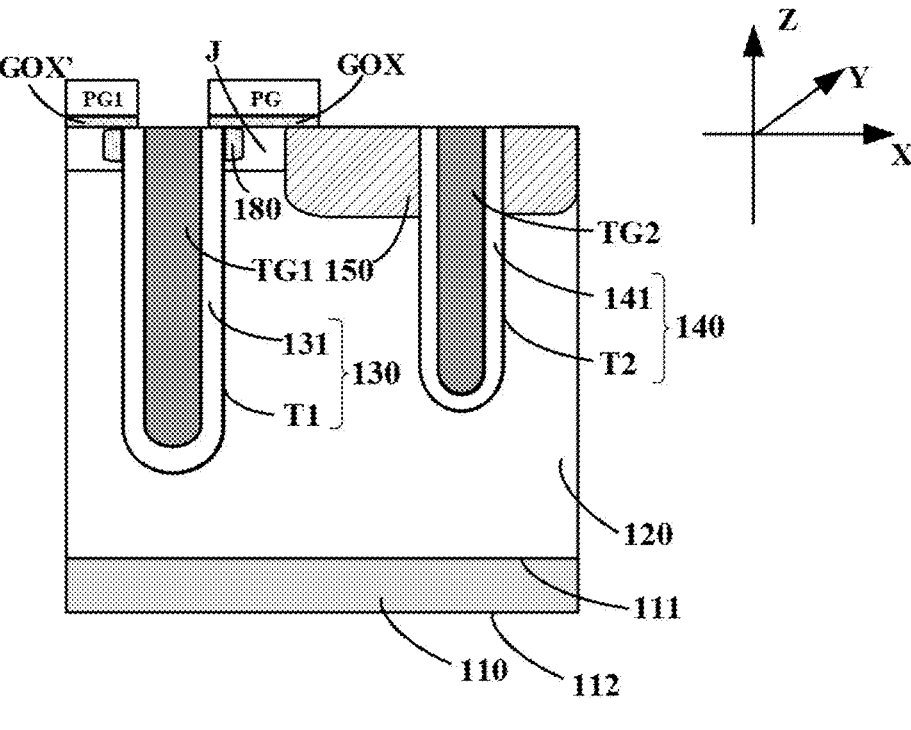

As shown in FIG. 20, in some embodiments, the doping process performed in Step 105 may also form a doping region 180 in the epitaxial layer 120. The doped region 180 is contiguous with the first gate dielectric layer 131, and the doped region 180 and the body region 150 are separated by the epitaxial layer 120. For example, the third gate structure PG' and the fourth gate structure PG1' can be used as masks at the same time. For the area between the third gate structure PG' and the fourth gate structure PG1', dopants are implanted in different directions such as the direction with an incident angle inclined to the Z direction, in the positive X direction, the negative X direction, the positive Y direction, and the negative Y direction, so as to form, so as to form the doped region 180 in the epitaxial layer 120 adjacent to the first gate dielectric layer 131. The doped region 180 and the body region 150 are separated by the epitaxial layer 120.

In this case, even if the actual position of the third gate structure PG' formed in Step 104 is offset relative to the expected position, by forming the doped region 180, the size of the epitaxial layer 120 under the third gate structure PG' in the second direction X can be remained substantially unchanged, which reduces the adverse impact caused by the positional deviation of the third gate structure PG'.

In Step 106, a first electrode region 160 having the first conductivity type is formed in the body region 150.

In some embodiments, as shown in FIG. 21, after Step 105, a lightly doped drain region LDD having the first conductivity type may be formed in the body region 150. For example, the first conductivity type is N type, the second conductivity type is P type, the body region 150 is a P type body region, and the lightly doped drain region LDD is an N type lightly doped drain region (NLDD).

Figure 22:
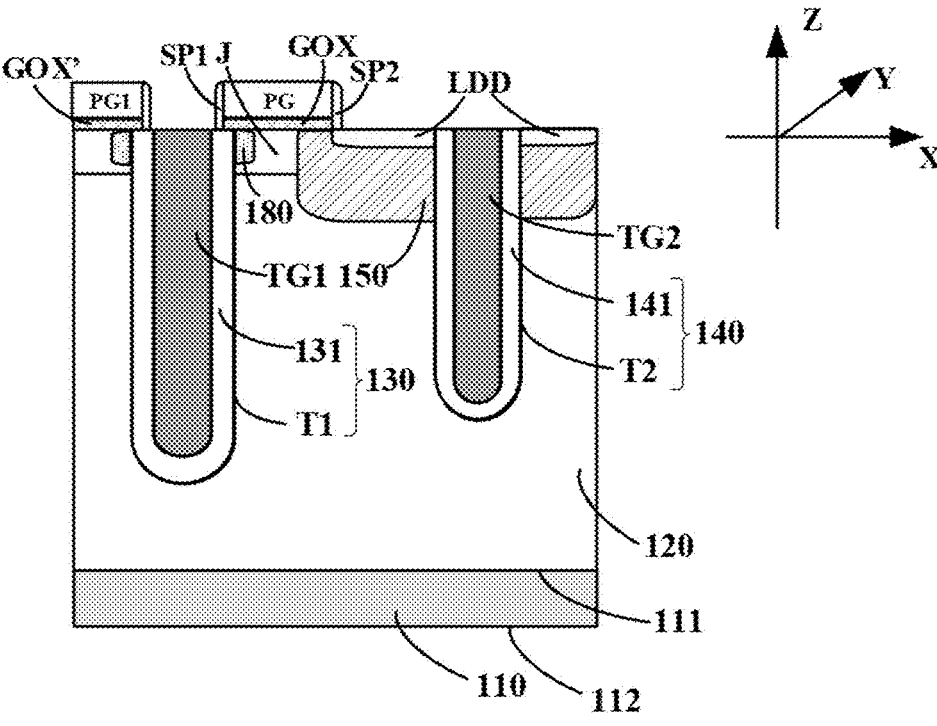

In some embodiments, as shown in FIG. 22, after forming the lightly doped region drain LDD, a first spacer SP1 and a second spacer SP2 can be formed on opposite sides of the third gate structure PG'. The first spacer SP1 is located on the surface of the first gate dielectric layer 131, and the second spacer SP2 is located on the surface of the body region 150. For example, the first spacer SP1 and the second spacer SP2 can be formed on two opposite sidewalls of the third gate structure PG' through a chemical vapor deposition process and a dry etching process.

In some embodiments, the materials of the first spacer SP1 and the second spacer SP2 may include silicon nitride or silicon oxide.

Figure 23:
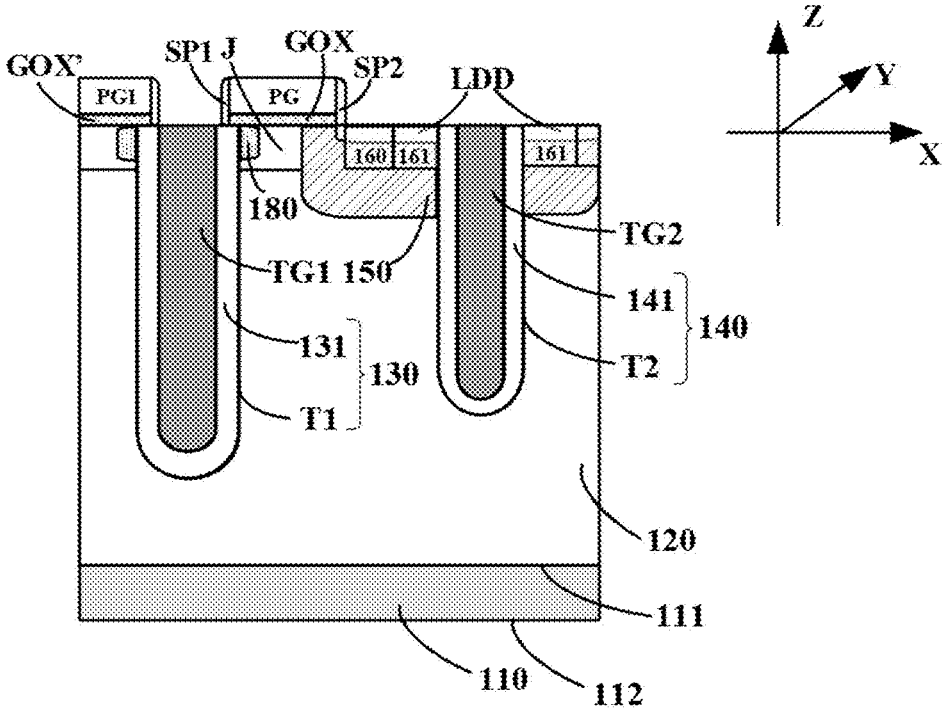

In some embodiments, as shown in FIG. 23, the first electrode region 160 having the first conductivity type may be formed in the body region 150 after forming the first spacer SP1 and the second spacer SP2. For example, the first electrode region 160 may be a source region.

In some embodiments, a doped region 161 having the second conductivity type may be formed in the body region 150. The doped region 161 is contiguous with the second gate structure 140. The first electrode region 160 is located between the first gate structure 130 and the doped region 161. For example, a lithography process and an ion implantation process may be performed to form the first electrode region 160 and the doped region 161 in the body region 150.

In Step 107, a second electrode 170 is formed under the substrate 110. For example, the second electrode 170 is formed on the second surface 112 of the substrate 110 opposing the first surface 111. For example, the second electrode 170 is a drain electrode, and the first electrode region 160 is a source region.

In this way, the manufactured semiconductor device has the first gate TG1 and the second gate TG2 with different depths. Since the first gate TG1 and the second gate TG2 with different depths change the electric field structure in the epitaxial layer 120, when avalanche breakdown occurs in the semiconductor device, current can be concentrated to the first electrode region 160 through the shortest path between the second electrode 170 and the first electrode region 160 (that is, through the area in the epitaxial layer closer to the second gate structure TG2). This reduces the possibility of turning on the parasitic transistor inside the semiconductor device, thereby improving the avalanche durability of the semiconductor device and reducing the risk of device damage.

In the related art, during the process of forming the first electrode region 160 in the body region 150, at least one of the first gate TG1 and the second gate TG2 is doped. During the annealing process, in order to avoid the doped conductive material or dopants in the first electrode region 160 from diffusing deeper into the body region 150, the annealing time will be limited (for example, limited to 10 to 20 seconds). As a result, the dopants doped in the first gate TG1 and the second gate TG2 is diffused unevenly, and the dopant content in the upper half of the first gate TG1 and the second gate TG2 is more than that in the lower half. The content causes the first gate TG1 and the second gate TG2 to have higher resistance in deeper parts, resulting in reduced performance of the first gate TG1 and the second gate TG2.

In light of this, embodiments of the present disclosure also provide the following solutions.

In some embodiments, at least one of the first gate TG1 and the second gate TG2 may be doped. For example, the first gate TG1 or the second gate TG2 may be doped. For another example, both the first gate TG1 and the second gate TG2 may be doped.

In some embodiments, as shown in FIG. 18, in Step 105, a body region 150 may be formed in the epitaxial layer 120 by performing a doping process, and a first annealing may be performed after forming the body region 150. In these embodiments, at least one of the first gate TG1 and the second gate TG2 may be doped before forming the body region 150.

In the above embodiments, doping of at least one of the first gate TG1 and the second gate TG2 is performed before forming the body region 150. In this way, since the first annealing is performed after the body region 150 is formed, the first annealing will allow the dopants used in the doping of at least one of the first gate TG1 and the second gate TG2 to be to be diffused deeper into the gate, thereby making the dopant doped in at least one of the first gate TG1 and the second gate TG2 diffuse more uniformly without affecting the first electrode region 160 subsequently formed in the body region 150. The performance of at least one of the first gate TG1 and the second gate TG2 is improved, thereby improving the performance of the manufactured semiconductor device.

In some embodiments, after forming the third gate dielectric layer GOX, a second annealing may be performed, and then the third gate PG may be formed. In these embodiments, at least one of the first gate TG1 and the second gate TG2 may be doped before forming the third gate dielectric layer GOX.

In the above embodiments, doping of at least one of the first gate TG1 and the second gate TG2 is performed before forming the third gate dielectric layer GOX. In this way, since the body region 150 is formed after the third gate dielectric layer GOX is formed, the second annealing is performed after the third gate dielectric layer GOX is formed, and the first annealing is performed after the body region 150 is formed, so through two anneals (i.e., first annealing and second annealing), the conductive material or dopants doped into at least one of the first gate TG1 and the second gate TG2 can be diffused deeper into the gate, thereby further improving the performance of at least one of the first gate TG1 and the second gate TG2 without affecting the first electrode region 160 subsequently formed in the body region 150, and the performance of manufactured semiconductor device can be further improved.

Figure 24:
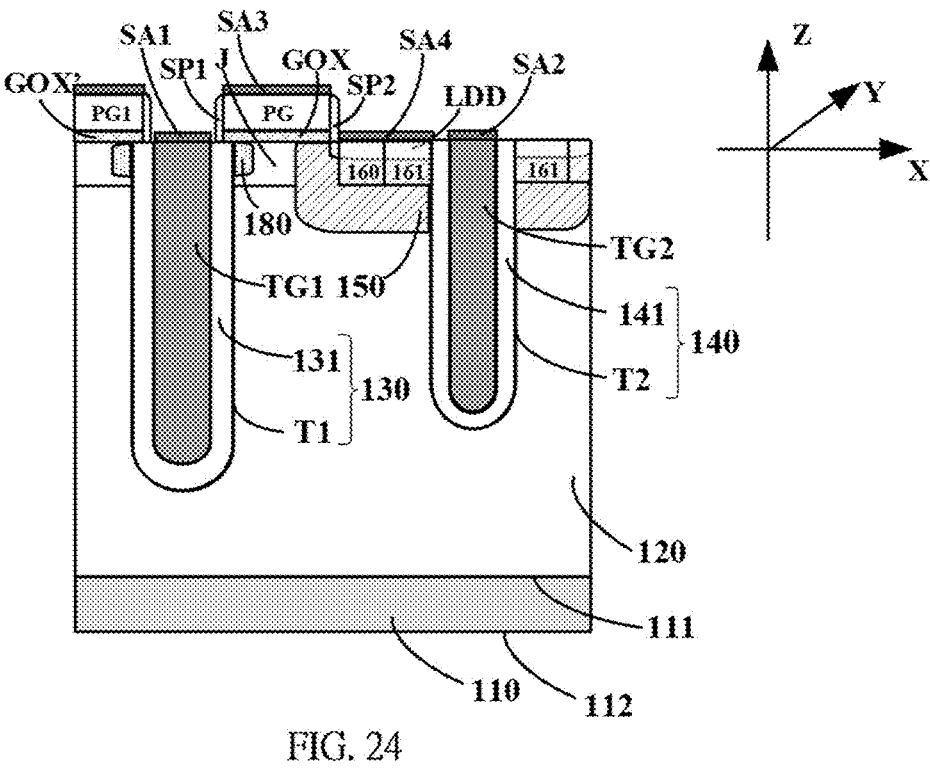

In some embodiments, as shown in FIG. 24, after forming the first spacer SP1 and the second spacer SP2, a first silicide layer SA1, a second silicide layer SA2, and a third silicide layer SA3 and the fourth silicide layer SA4 can be formed. The first silicide layer SA1 is located on the top surface of the first gate TG1, the second silicide layer SA2 is located on the top surface of the second gate TG2, the third silicide layer SA3 is located on the top surface of the third gate structure PG', and the fourth silicide layer SA4 is located on the top surface of the first electrode region 160.

In some embodiments, the materials of the first silicide layer SA1, the second silicide layer SA2, the third silicide layer SA3 and the fourth silicide layer SA4 may include cobalt silicide, nickel silicide, tungsten silicide, titanium silicide, etc.

In this way, after the first spacer SP1 and the second spacer SP2 are formed, without the need of additional photomask, the first silicide layer SA1, the second silicide layer SA2, the third silicide layer SA3 and the fourth silicide layer SA4 can be formed on the top surface of the first gate TG1, the top surface of the second gate TG2, and the top surface of the third gate PG', and the top surface of the first electrode region 160 respectively, thereby simplifying the manufacturing process of semiconductor device and improving the manufacturing efficiency of the semiconductor device.

Figure 25:
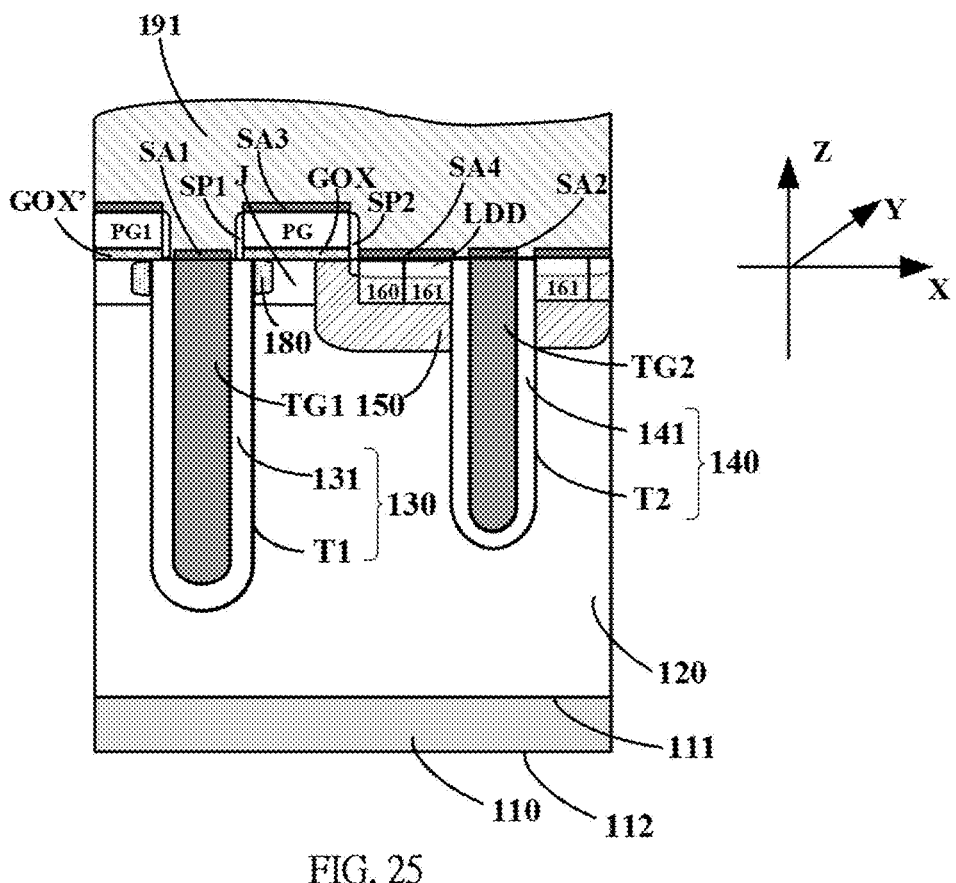

In some embodiments, as shown in FIG. 25, an insulating layer 191 covering the first silicide layer SA1, the second silicide layer SA2, the third silicide layer SA3 and the fourth silicide layer SA4 may be formed on the epitaxial layer 120.

Figure 26:
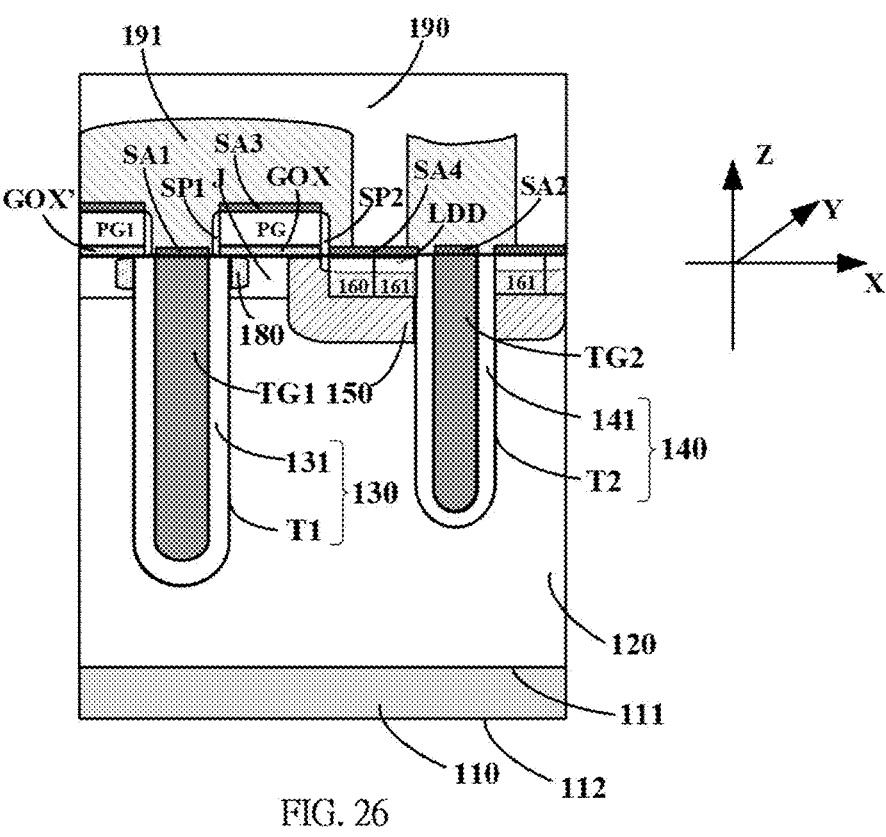

In some embodiments, as shown in FIG. 26, a metal layer 190 may be formed in the insulating layer 191. The metal layer 190 may be located on the fourth silicide layer SA4 and be electrically connected to the first electrode region 160 via the fourth silicide layer SA4. The metal layer 190 and the third gate structure PG' are separated by an insulating layer 191. For example, the first electrode region 160 is the source region and the metal layer 190 may serve as the source.

Figure 27:
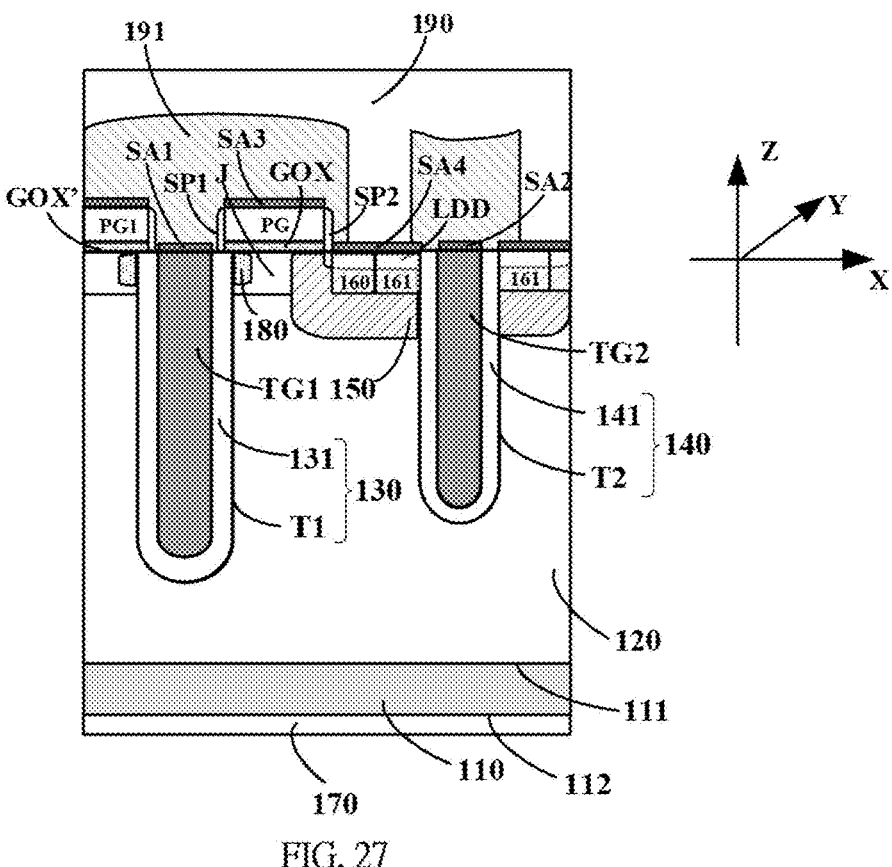

In some embodiments, as shown in FIG. 27, Step 107 may be performed after the metal layer 190 is formed to form the second electrode 170 on the second surface 112 of the substrate 110. For example, the metal layer 190 is the source electrode and the second electrode 170 is the drain electrode.

FIG. 28 is a schematic flowchart of a manufacturing method of a semiconductor device according to some embodiments of the present disclosure. As shown in FIG. 28, the manufacturing method of a semiconductor device includes Steps 201-208. It noteworthy that Steps 201-208 may not be executed sequentially in the order described below. For example, Step 208 may be performed after Step 201, that is, Step 208 may be performed before Step 202. The manufacturing method of the semiconductor device shown in FIG. 28 will be described below with reference to the aforementioned FIGS. 12-27.

In Step 201, a substrate 110 having a first conductivity type is provided.

As shown in FIG. 12, the substrate 110 has opposing first surfaces 111 and second surfaces 112. In some embodiments, the material of the substrate 110 may be a semiconductor material such as silicon.

In Step 202, an epitaxial layer 120 having the first conductivity type is formed over the substrate 110, as shown in FIG. 12. The first conductive type may be N type or P type.

In Step 203, as shown in FIG. 13, a first trench T1 is formed in the epitaxial layer 120.

For example, the first trench T1 may be formed in the epitaxial layer 120 through a dry etching process. In some embodiments, a second trench T2 may be formed in the epitaxial layer 120.

In Step 204, a first gate structure 130 is formed in the first trench T1.

The first gate structure 130 includes a first gate TG1 located in the first trench T1 and a first gate dielectric layer 131 located between the first gate TG1 and the epitaxial layer 120.

The first gate dielectric layer 131 may include a first portion 1311 located on the first sidewall of the first trench T1, a second portion 1312 located on the second sidewall of the first trench T1, and a third portion 1313 located on the bottom of the first trench T1. The third portion 1313 connects the first portion 1311 with the second portion 1312.

In some embodiments, as shown in FIGS. 14-16, the first gate structure 130 can be formed in the first trench T1 in the manner shown in the aforementioned Steps S1-S3. For specific description, please refer to the aforementioned Steps S1-S3, which will not be repeated here.

In Step 205, a third gate structure PG' is formed on the top surface of the epitaxial layer 120.

In some embodiments, as shown in FIG. 17, after the first gate structure 130 is formed, a doping process may be performed to form the well region J in the epitaxial layer 120, and then the third gate structure PG' is formed after the well region J is formed.

As some implementation methods, as shown in FIG. 18, the third gate dielectric layer GOX can be formed first on the surface of the epitaxial layer 120 away from the substrate 110, and then, a third gate PG can be formed on the surface of the third gate dielectric layer GOX away from the substrate 110, thereby forming a third gate structure PG' including the third gate dielectric layer GOX and the third gate PG.

As shown in FIG. 18, the formed third gate structure PG' partially overlaps with the body region 150 and partially overlaps with the first gate dielectric layer 131. In some embodiments, the size of the overlapping portion of the third gate structure PG' and the first gate dielectric layer 131 in the second direction X is less than or equal to 0.1 micrometers.

In Step 206, after forming the third gate structure PG', a doping process is performed to form the body region 150 and the doped region 180 with the second conductivity type in the epitaxial layer 120, as shown in FIGS. 19-20.

The body region 150 partially overlaps the third gate structure PG' and is spaced apart from the first gate dielectric layer 130. The doped region 180 is contiguous with the first gate dielectric layer 131, and the doped region 180 and the body region 150 are separated by the epitaxial layer 120. The second conductivity type is different from the first conductivity type.

In Step 207, a first electrode region 160 having the first conductivity type is formed in the body region 150.

In some embodiments, as shown in FIG. 21, after Step 105, a lightly doped drain region LDD having the first conductivity type may be formed in the body region 150.

In some embodiments, as shown in FIG. 22, after forming the lightly doped region drain LDD, a first spacer SP1 and a second spacer SP2 can be formed on opposite sides of the third gate structure PG'. The first spacer SP1 is located on the surface of the first gate dielectric layer 131, and the second spacer SP2 is located on the surface of the body region 150.

In some embodiments, as shown in FIG. 23, a first electrode region 160 having the first conductivity type may be formed in the body region 150 after forming the first spacer SP1 and the second spacer SP2.

In some embodiments, a doped region 161 having the second conductivity type may be formed in the body region 150. The doped region 161 is contiguous with the second gate structure 140, and the first electrode region 160 is located between the first gate structure 130 and the doped region 161.

In Step 208, a second electrode 170 is formed under the substrate 110. For example, the second electrode 170 is a drain electrode, and the first electrode region 160 is a source region.

In this way, the third gate structure PG' of the fabricated semiconductor device partially overlaps the first gate dielectric layer 131, which helps to reduce the adverse effects on semiconductor device when the actual position of the third gate structure PG' deviates from the expected position.

In some embodiments, after forming the first spacer SP1 and the second spacer SP2, a first silicide layer SA1, a third silicide layer SA3 and a fourth silicide layers SA4 may be formed. The first silicide layer SA1 is located on the top surface of the first gate TG1, the third silicide layer SA3 is located on the top surface of the third gate structure PG', and the fourth silicide layer SA4 is located on the top surface of the first electrode region 160.

In this way, after the first spacer SP1 and the second spacer SP2 are formed, without the need of additional photomask, the first silicide layer SA1, the third silicide layer SA3 and the fourth silicide layer SA4 are formed on the top surface of the first gate TG1, on the top surface of the third gate structure PG' and on the top surface of the electrode region 160 respectively, thereby simplifying the manufacturing process of the semiconductor device and improving the manufacturing efficiency of the semiconductor device.

In some embodiments, after forming the third gate structure PG', a doping process may be performed to form two body regions 150 having the second conductivity type in the epitaxial layer 120.

In some embodiments, a fourth gate structure PG1' may also be formed on the top surface of the epitaxial layer 120. The fourth gate structure PG1' includes a fourth gate PG1 and a fourth gate dielectric layer GOX' located between a surface of the epitaxial layer 120 away from the substrate 110 and the fourth gate PG1. In these embodiments, the third gate structure PG' partially overlaps the first portion 1311 of the first gate dielectric layer 131 and partially overlaps one of the two body regions 150. The fourth gate structure PG1' partially overlaps the second portion 1312 of the first gate dielectric layer 131 and partially overlaps the other body region 150 of the two body regions 150. It should be understood that the formation of the fourth gate structure PG1' is similar to the formation of the third gate structure PG', and will not be described again for the sake of simplicity.

In some embodiments, two doped regions 180 may be formed in the epitaxial layer 120 by performing a doping process. One of the two doped regions 180 is separated from one of the two body regions 150 by the epitaxial layer 120, and the one doped region 180 is contiguous with the first portion 1311 of the first gate structure 130; the other doped region 180 of the two doped regions 180 is separated from the other body region 150 of the two body regions 150 by the epitaxial layer 120, and the other doped region 180 is contiguous with the second portion 1312 of first gate structure 130.

The manufacturing method of the semiconductor device shown in FIG. 28 may also include other steps of forming other structures. For detailed description, please refer to the description of the related embodiments in FIG. 11 and FIG. 12 to FIG. 27, which will not be described again here.

The semiconductor devices and manufacturing methods provided by the embodiments of the present disclosure can be used in combination with each other. Up to this point, various embodiments of the present disclosure have been described in detail. To avoid obscuring the concepts of the present disclosure, some details that are well known in the art have not been described. Based on the above description, those skilled in the art can completely understand how to implement the technical solution disclosed here.

Although some specific embodiments of the present disclosure have been described in detail through examples, those skilled in the art will understand that the above examples are for illustration only and are not intended to limit the scope of the disclosure. Those skilled in the art should understand that the above embodiments can be modified or some technical features can be equivalently replaced without departing from the scope and spirit of the present disclosure. The scope of the present disclosure is defined by the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a first conductivity type;
   an epitaxial layer having the first conductivity type on the substrate;
   a first trench in the epitaxial layer;

a first gate structure including a first gate in the first trench, and a first gate dielectric layer between the first gate and the epitaxial layer, wherein the first gate dielectric layer includes a first portion and a second portion on two opposite sides of the first gate structure, respectively;

a first body region and a second body region having a second conductivity type in the epitaxial layer and on the two opposite sides of the first gate structure, respectively, wherein the first body region and the second body region are spaced from the first gate dielectric layer, wherein the second conductivity type is different from the first conductivity type;

a first doped region and a second doped region having the second conductivity type and being disposed on the two opposite sides of the first gate structure, respectively, wherein the first doped region is separated from the first body region by the epitaxial layer and is contiguous with the first portion of the first gate dielectric layer;

wherein the second doped region is separated from the second body region by the epitaxial layer and is contiguous with the second portion of the first gate dielectric layer;

a third gate structure and a fourth gate structure on a top surface of the epitaxial layer and on the two opposite sides of the first gate structure, respectively, wherein the third gate structure partially overlaps the first portion of the first gate dielectric layer and partially overlaps the first body region and the fourth gate structure partially overlaps the second portion of the first gate dielectric layer and partially overlaps the second body region; and a second electrode under the substrate.

2. The semiconductor device according to claim 1, wherein the third gate structure does not overlap with the first gate.

3. The semiconductor device according to in claim 1, further comprising:

a first spacer and a second spacer located on opposite sides of the third gate structure, wherein the first spacer is located on a surface of the first gate dielectric layer, and the second spacer is located on a surface of the first body region.

4. The semiconductor device according to claim 1, wherein an extending direction of the third gate structure is first direction, and a size of an overlapping portion between the third gate structure and the first gate dielectric layer in second direction is less than or equal to 0.1 micrometers, and the second direction is substantially perpendicular to the first direction.

5. The semiconductor device according to claim 1, wherein the first gate dielectric layer includes a third portion on a bottom of the first trench, wherein the third portion connects the first portion with the second portion.

6. The semiconductor device according to claim 1, wherein:

the first conductivity type is N type and the second conductivity type is P type;

wherein a first electrode region having the first conductivity type is disposed in the first body region, and wherein the first electrode region is a source region, and the second electrode is a drain.

7. A method for manufacturing a semiconductor device, comprising:

providing a substrate having a first conductivity type;

forming an epitaxial layer having the first conductivity type on the substrate;

forming a first trench in the epitaxial layer;

forming a first gate structure in the first trench, wherein the first gate structure comprises a first gate in the first trench, and a first gate dielectric layer between the first gate and the epitaxial layer;

forming a third gate structure on a top surface of the epitaxial layer, wherein the third gate structure comprises a third gate and a third gate dielectric layer between the epitaxial layer and the third gate, wherein the third gate structure partial overlap the first gate dielectric layer;

after forming the third gate structure, performing a doping process to form a first body region and a first doped region having a second conductivity type in the epitaxial layer, wherein the first body region partially overlaps the third gate structure, wherein the first body region is spaced apart from the first gate dielectric layer, and the first doped region is contiguous with the first gate dielectric layer, wherein the first doped region is separated from the first body region by the epitaxial layer, and wherein the second conductivity type is different from the first conductivity type;

forming a first electrode region having the first conductivity type in the first body region; and forming a second electrode under the substrate.

8. The method of claim 7, further comprising:

forming a first spacer and a second spacer on opposite sides of the third gate structure, wherein the first spacer is located on a surface of the first gate dielectric layer, the second spacer is located on a surface of the first body region.

9. The method of claim 8, further comprising:

after forming the first spacer and the second spacer, forming a first silicide layer, a third silicide layer and a fourth silicide layer;

wherein the first silicide layer is located on a top surface of the first gate, and the third silicide layer is located on a top surface of the third gate structure, and the fourth silicide layer is located on a top surface of the first electrode region.

10. The method of claim 7, wherein an extending direction of the third gate structure is first direction, and a size of an overlapping portion between the third gate structure and the first gate dielectric layer in the second direction is less than or equal to 0.1 micrometers, and wherein the second direction is substantially perpendicular to the first direction.

11. The method of claim 7, further comprising:

doping the first gate.

12. The method of claim 11, wherein the first gate is doped before forming the first body region;

wherein the method further comprises:

performing a first annealing after forming the first body region.

13. The method of claim 12, wherein said forming the third gate structure comprises:

forming the third gate dielectric layer on the top surface of the epitaxial layer;

after forming the third gate dielectric layer, performing a second annealing; and forming the third gate on the third gate dielectric layer;

wherein before forming the third gate dielectric layer, the first gate is doped.

14. The method of claim 7, further comprising:

when forming the third gate structure, simultaneously forming a fourth gate structure on a top surface of the epitaxial layer, and the third gate structure and the fourth gate structure are respectively located on opposite sides of the first gate structure, wherein the fourth gate structure comprises a fourth gate and a fourth gate dielectric layer between the epitaxial layer and the fourth gate, wherein the fourth gate structure partial overlaps the first gate dielectric layer.

15. The method of claim 7, further comprising:

when performing the doping process to form the first body region and the first doped region, simultaneously forming a second doped region having the second conductivity type in the epitaxial layer, and the first doped region and the second doped region are respectively located on opposite sides of the first gate structure, and the second doped region is contiguous with the first gate dielectric layer.

* * * * *